(12) United States Patent
Wild et al.

(10) Patent No.: US 10,597,291 B2
(45) Date of Patent: Mar. 24, 2020

(54) DISPOSABLE MICROFLUIDIC CARTRIDGE

(71) Applicant: The University of British Columbia, Vancouver (CA)

(72) Inventors: Andre Wild, Vancouver (CA); Timothy Leaver, Delta (CA); Colin Walsh, Belmont, CA (US); Gesine Heuck, Vancouver (CA); Anitha Thomas, New Westminster (CA); Aysha Ansari, Calgary (CA); Kevin Ou, Toronto (CA); Robert James Taylor, Vancouver (CA); Euan Ramsay, Vancouver (CA)

(73) Assignee: The University of British Columbia, Vancouver (CA)

( * ) Notice: Subject to any disclaimer, the term of this patent is extended or adjusted under 35 U.S.C. 154(b) by 152 days.

(21) Appl. No.: 15/796,646

(22) Filed: Oct. 27, 2017

(65) Prior Publication Data

US 2018/0111830 A1    Apr. 26, 2018

Related U.S. Application Data

(63) Continuation of application No. PCT/US2016/029879, filed on Apr. 28, 2016.
(Continued)

(51) Int. Cl.
*B01F 13/00* (2006.01)
*B01F 5/06* (2006.01)
(Continued)

(52) U.S. Cl.
CPC ............ *B82Y 40/00* (2013.01); *B01F 5/061* (2013.01); *B01F 5/0644* (2013.01);
(Continued)

(58) Field of Classification Search
CPC .............. B01F 13/0059; B01F 13/0064; B01F 2005/0636; B01F 5/061; B01F 5/0644;
(Continued)

(56) References Cited

U.S. PATENT DOCUMENTS 3,159,312 A    12/1964 Sciver, II
3,394,924 A    7/1968 Harder
(Continued)

FOREIGN PATENT DOCUMENTS

CA    2 918 368 A1    1/2015
CA    2 927 358 A1    4/2015
(Continued)

OTHER PUBLICATIONS

Howell, P.B. Jr., et al., "Design and Evaluation of a Dean Vortex-Based Micromixer," Lab on a Chip 4(6):663-669, Dec. 2004. (Year: 2004).*
(Continued)

*Primary Examiner* — Jennifer Wecker
(74) *Attorney, Agent, or Firm* — Christensen O'Connor Johnson Kindness PLLC

(57) ABSTRACT

The present disclosure is directed towards a disposable microfluidic cartridge configured for use in a system for the small scale production of nanoparticles used in scientific research or therapeutic applications. The system can be used to produce a wide variety of nanoparticles, including but not limited to lipid and polymer nanoparticles, carrying a variety of payloads. The system provides for a simple workflow which in certain embodiments can be used to produce a sterile product.

24 Claims, 14 Drawing Sheets

Related U.S. Application Data

(60) Provisional application No. 62/275,630, filed on Jan. 6, 2016, provisional application No. 62/154,043, filed on Apr. 28, 2015.

(51) Int. Cl.
*B81B 1/00* (2006.01)
*B01L 9/00* (2006.01)
*B82Y 40/00* (2011.01)

(52) U.S. Cl.
CPC ........ *B01F 5/0647* (2013.01); *B01F 13/0059* (2013.01); *B01F 13/0064* (2013.01); *B01L 9/527* (2013.01); *B81B 1/00* (2013.01); *B01F 2005/0636* (2013.01); *B01L 2200/025* (2013.01); *B01L 2300/0816* (2013.01)

(58) Field of Classification Search
CPC ............ B01F 5/0647; B01L 2200/025; B01L 2300/0816; B01L 9/527; B81B 1/00; B82Y 40/00
See application file for complete search history.

(56) References Cited

U.S. PATENT DOCUMENTS

| | | | |
|---|---|---|---|
| 3,404,869 | A | 10/1968 | Harder |
| 3,574,485 | A | 4/1971 | Herman, Jr. |
| 3,855,368 | A | 12/1974 | Prochazka et al. |
| 3,927,868 | A | 12/1975 | Moore |
| 4,027,857 | A | 6/1977 | Cunningham |
| 4,629,589 | A | 12/1986 | Gupta et al. |
| 4,732,585 | A | 3/1988 | Lerner |
| RE33,444 | E | 11/1990 | Lerner |
| 5,335,992 | A | 8/1994 | Holl |
| 6,331,072 | B1 | 12/2001 | Schierholz et al. |
| 6,399,031 | B1 | 6/2002 | Herrmann et al. |
| 6,457,854 | B1 | 10/2002 | Koop et al. |
| 9,500,664 | B2 | 11/2016 | Ness et al. |
| 2002/0023841 | A1 | 2/2002 | Ahn et al. |
| 2003/0040105 | A1 | 2/2003 | Sklar et al. |
| 2004/0037161 | A1 | 2/2004 | Honda et al. |
| 2004/0191086 | A1 | 9/2004 | Paukovits, Jr. et al. |
| 2004/0238355 | A1 | 12/2004 | Kimizuka |
| 2004/0248291 | A1 | 12/2004 | Yamamoto et al. |
| 2004/0265184 | A1 | 12/2004 | Matsuda et al. |
| 2006/0087048 | A1 | 4/2006 | Mello et al. |
| 2006/0101775 | A1 | 5/2006 | Miyake et al. |
| 2006/0171864 | A1 | 8/2006 | Caze et al. |
| 2006/0280029 | A1 | 12/2006 | Garslecki et al. |
| 2007/0017633 | A1 | 1/2007 | Tonkovich et al. |
| 2007/0081923 | A1 | 4/2007 | Choe et al. |
| 2007/0089460 | A1 | 4/2007 | Lindig et al. |
| 2007/0225532 | A1 | 9/2007 | Tonkovich et al. |
| 2009/0087509 | A1 | 4/2009 | Linares |
| 2009/0142846 | A1* | 6/2009 | Crenshaw ............. B01F 5/0646 436/34 |
| 2010/0022680 | A1* | 1/2010 | Karnik ............... A61K 47/6937 523/105 |
| 2011/0003325 | A1* | 1/2011 | Durack ................ B01L 3/5027 435/29 |
| 2011/0315227 | A1 | 12/2011 | Shu |
| 2012/0085644 | A1 | 4/2012 | Renzi et al. |
| 2012/0115755 | A1 | 5/2012 | Oh et al. |
| 2012/0121481 | A1 | 5/2012 | Romanowsky et al. |
| 2012/0174772 | A1 | 7/2012 | Knobel |
| 2012/0276209 | A1 | 11/2012 | Cullis et al. |
| 2012/0300576 | A1* | 11/2012 | Li ........................ B01F 5/0646 366/338 |
| 2013/0236375 | A1* | 9/2013 | Tan ..................... B01L 3/50273 422/502 |
| 2013/0260474 | A1* | 10/2013 | Chan ....................... G01N 1/38 436/174 |
| 2014/0038214 | A1 | 2/2014 | Neeves et al. |
| 2015/0025461 | A1 | 1/2015 | Corso et al. |
| 2015/0297834 | A1 | 10/2015 | Buder et al. |
| 2016/0022580 | A1* | 1/2016 | Ramsay ............. A61K 31/7105 424/450 |
| 2016/0068883 | A1* | 3/2016 | Luo ........................ B01F 5/0619 435/31 |
| 2016/0130640 | A1* | 5/2016 | Wright ................ B01F 7/00116 506/39 |

FOREIGN PATENT DOCUMENTS

| | | |
|---|---|---|
| CN | 103906503 A | 7/2014 |
| DE | 103 56 308 A1 | 6/2005 |
| WO | 2008/039209 A1 | 4/2008 |
| WO | 2014/172045 A1 | 10/2014 |

OTHER PUBLICATIONS

Deshpande, A., "Polystyrene Properties," Buzzle, Feb. 1, 2013, <http://www.buzzle.com/articles/polystyreneproperties.html> [retrieved Jul. 11, 2016], pp. 1-6; especially p. 3, table entitled "Mechanical Properties."

Howell, P.B. Jr., et al., "Design and Evaluation of a Dean Vortex-Based Micromixer," Lab on a Chip 4(6):663-669, Dec. 2004.

International Search Report and Written Opinion dated Sep. 2, 2016, issued in corresponding International Application No. PCT/US2016/29879, filed Apr. 28, 2016, 18 pages.

Partial Search Report and Invitation to Pay Additional Fees dated Sep. 21, 2018, issued in corresponding European Application No. 16756307.1, filed Feb. 24, 2016, 23 pages.

International Preliminary Report on Patentability dated Nov. 9, 2017, issued in corresponding International Application No. PCT/US2016/029879, filed Apr. 28, 2016, 15 pages.

Extended European Search Report dated Feb. 8, 2019, issued in corresponding European Application No. 16756307.1, filed Feb. 24, 2016, 17 pages.

Supplementary European Search Report dated Aug. 1, 2019, issued in corresponding European Application No. 16882817.6, filed Aug. 24, 2016, 9 pages.

Chen et al., "Optimal Designs of Staggered Dean Vortex Micromixers," International Journal of Molecular Sciences 12(6):3500-3524, Jan. 11, 2011.

First Office Action dated Jun. 24, 2019, issued in corresponding Chinese Application No. 201680022904.1, filed Feb. 24, 2016, 6 pages.

Search Report dated Jun. 24, 2019, issued in corresponding Chinese Application No. 201680022904.1, filed Feb. 24, 2016, 3 pages.

Extended European Search Report dated Dec. 14, 2018, issued in corresponding European Application No. 16787188.8, filed Apr. 28, 2016, 9 pages.

International Search Report and Written Opinion dated May 17, 2016, issued in corresponding International Application No. PCT/US16/19414, filed Feb. 24, 2016, 20 pages.

International Search Report and Written Opinion dated Nov. 2, 2016, issued in corresponding International Application No. PCT/CA2016/050997, filed Aug. 24, 2016, 6 pages.

International Preliminary Report on Patentability dated Aug. 29, 2017, issued in corresponding International Application No. PCT/US2016/019414, filed Feb. 24, 2016, 12 pages.

* cited by examiner

DISPOSABLE MICROFLUIDIC CARTRIDGE

CROSS-REFERENCES TO RELATED APPLICATIONS

This application is a continuation of International Application No. PCT/US2016/029879, filed Apr. 28, 2016, which claims the benefit of U.S. Patent Application No. 62/154,043, filed Apr. 28, 2015, and U.S. Patent Application No. 62/275,630, filed Jan. 6, 2016, the disclosures of which are hereby incorporated by reference in their entirety.

BACKGROUND

Microfluidic mixers have found use in research labs as a means for mixing small volumes of fluids in order to conserve precious materials and/or prepare small (e.g., single batch) amounts of product. Synthesis of lipid nanoparticles is one of many uses for microfluidic mixers.

As microfluidics finds an expanded role in research, development, and production, users will desire lower costs, easier manufacturing, and simplified operation of microfluidic mixers while maximizing performance.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a microfluidic cartridge is provided that is disposable and is configured to mix a first solution with a second solution to produce a mixed solution. In one embodiment, the microfluidic cartridge includes:

(A) a carrier, comprising a first inlet connector, a second inlet connector, and an outlet opening;

(B) a first microfluidic structure integrally incorporated into the carrier, the microfluidic structure comprising:

(I) a first inlet microchannel configured to receive fluid from first inlet connector;

(II) a second inlet microchannel configured to receive fluid from the second inlet connector;

(III) a first mixer configured to:
receive a first solution from the first inlet microchannel and a second solution from the second inlet microchannel;
mix the first solution and the second solution to provide a mixed solution, and
direct the mixed solution into an outlet microchannel; and (IV) the outlet microchannel, which is in fluid communication with the outlet opening.

In another aspect, a sterile package filled with sterile contents is provided. In one embodiment, the sterile package includes a microfluidic cartridge according to any of the embodiments disclosed herein in a sterile state and sealed within the sterile package.

In another aspect, a method of forming nanoparticles is provided. In one embodiment, the method includes flowing a first solution and a second solution through a microfluidic cartridge according to any of the disclosed embodiments and forming a nanoparticle solution in the first mixer.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1A:
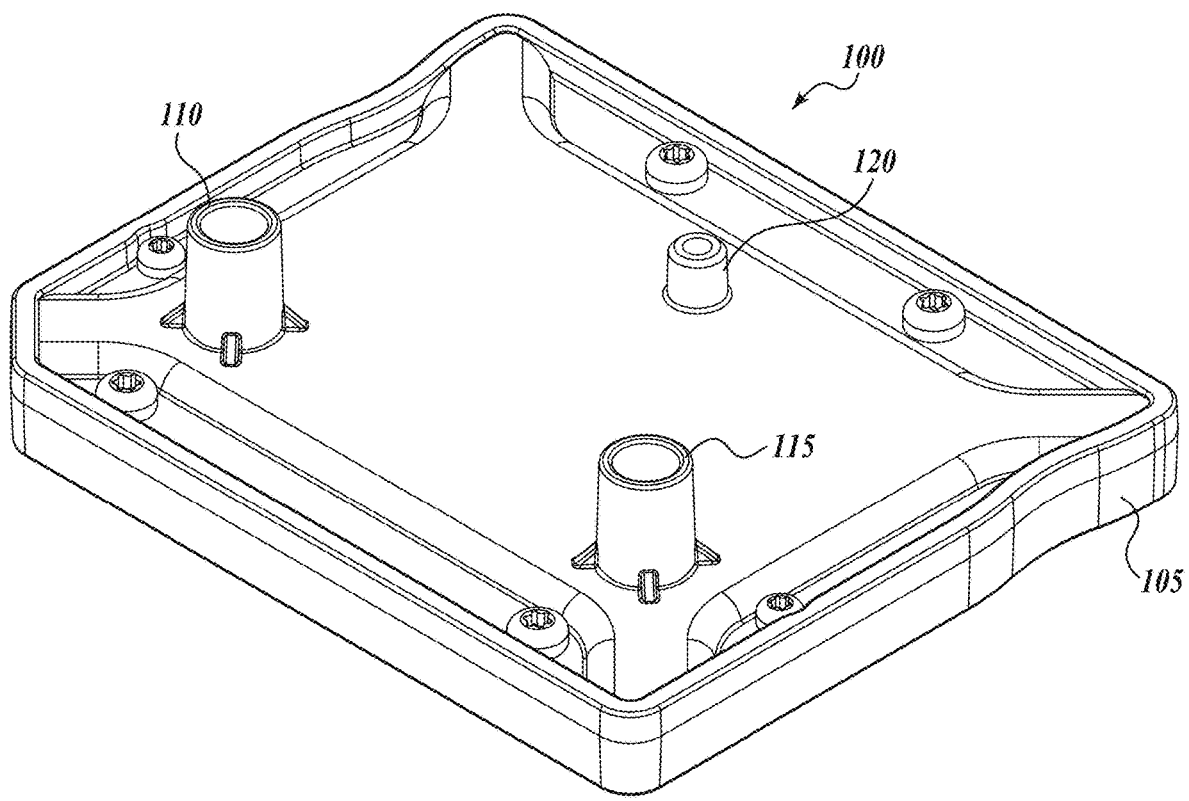
FIGS. 1A-1C illustrate microfluidic cartridges in accordance with embodiments disclosed herein.

The present disclosure is directed towards a disposable microfluidic cartridge configured for use in a system for the small scale production of nanoparticles used in scientific research or therapeutic applications. The system can be used to produce a wide variety of nanoparticles, including but not limited to lipid and polymer nanoparticles, carrying a variety of payloads. The system provides for a simple workflow which in certain embodiments can be used to produce a sterile product.

The microfluidic cartridge provides a convenient, disposable platform for combining two or more microfluidic streams within a microfluidic mixer. Currently produced microfluidic mixer systems include a permanent (non-disposable, reusable) metal housing into which a microfluidic "chip" is placed (e.g., as used in the NanoAssemblr manufactured by Precision Nanosystems Inc. of Vancouver, BC). The metal housing includes the inlets that connect to sources of solution (e.g., pumps or syringes). For each use, the microfluidic layer must be carefully positioned within the metal housing and sealed against the inlets and outlet in order to produce a fluid-tight path through the microfluidics and the metal housing. Other microfluidic products include non-disposable, non-metal mixers, such as those sold by Dolomite (Royston, UK). The disclosed microfluidic cartridge provides a benefit over these two-part systems that require laborious set-up time—in the form of fitting the microfluidic layer into the metal holder. The disclosed embodiments also allow for simplified access to sterile microfluidic mixing due to the ability to provide a pre-sterilized microfluidic cartridge having a sterile fluidic path.

Furthermore, the described system minimizes user assembly by integrating fittings and microfluidics into one cartridge. This integration allows for more reliable operation (eliminating user assembly steps), higher operating pressures and minimizes internal volume. The disposable nature of the cartridge reduces the risk of cross-contamination and reduces experimental time by eliminating the need for washing.

In particular, the present disclosure provides an apparatus for the manufacture of nanoparticles, which enables the simple, rapid and reproducible manufacture of nanoparticles at laboratory scales (0.5-20 mL) for applications such as fundamental research, particle characterization, material screening and in-vitro and in-vivo studies using a disposable cartridge. This disclosure employs microfluidics which has the advantage of exquisite control over environmental factors during manufacture, and microfluidics possesses the further advantage of allowing seamless scale-up via parallelization. The disclosed embodiments are configured to mix the first solution with the second solution through a microfluidic mixer. Many methods for this mixing process are known. Compatible microfluidic mixing methods and devices are disclosed in:

(1) U.S. patent application Ser. No. 13/464,690, which is a continuation of PCT/CA2010/001766, filed Nov. 4, 2010, which claims the benefit of U.S. Ser. No. 61/280,510, filed Nov. 4, 2009;

(2) U.S. patent application Ser. No. 14/353,460, which is a continuation of PCT/CA2012/000991, filed Oct. 25, 2012, which claims the benefit of U.S. Ser. No. 61/551,366, filed Oct. 25, 2011;

(3) PCT/US2014/029116, filed Mar. 14, 2014 (published as WO2014172045, Oct. 23, 2014), which claims the benefit of U.S. Ser. No. 61/798,495, filed Mar. 15, 2013;

(4) PCT/US2014/041865, filed Jul. 25, 2014 (published as WO2015013596, Jan. 29, 2015), which claims the benefit of U.S. Ser. No. 61/858,973, filed Jul. 26, 2013; and (5) PCT/US2014/060961, which claims the benefit of U.S. Ser. No. 61/891,758, filed Oct. 16, 2013; and (6) U.S. Provisional Patent Application No. 62/120,179, filed Feb. 24, 2015, the disclosures of which are hereby incorporated by reference in their entirety.

Microfluidic Cartridge

In one aspect, a microfluidic cartridge is provided that is disposable and is configured to mix a first solution with a second solution to produce a mixed solution. In one embodiment, the microfluidic cartridge includes:

(A) a carrier, comprising a first inlet connector, a second inlet connector, and an outlet opening;

(B) a first microfluidic structure integrally incorporated into the carrier, the microfluidic structure comprising:

(I) a first inlet microchannel configured to receive fluid from first inlet connector;

(II) a second inlet microchannel configured to receive fluid from the second inlet connector;

(III) a first mixer configured to:

receive a first solution from the first inlet microchannel and a second solution from the second inlet microchannel;

mix the first solution and the second solution to provide a mixed solution, and direct the mixed solution into an outlet microchannel; and (IV) the outlet microchannel, which is in fluid communication with the outlet opening.

Embodiments of the microfluidic cartridge will now be described with reference to FIGURES, where like numbers indicate like parts. Referring to FIG. 1A, a microfluidic cartridge 100 includes a carrier 105 that includes a first inlet connector 110, a second inlet connector 115, and an outlet opening 120. The inlet connectors 110 and 115 are configured to form a fluid-tight connection with sources of solution to be mixed in the cartridge 100.

Sources of solution (also referred to as "reservoirs") include syringes and pumps. The microfluidic cartridge can be made compatible with any source of solution by way of appropriate configuration of the inlet connectors 110 and 115 to mate with the opposite connectors attached to the sources of solution.

Figure 1B:
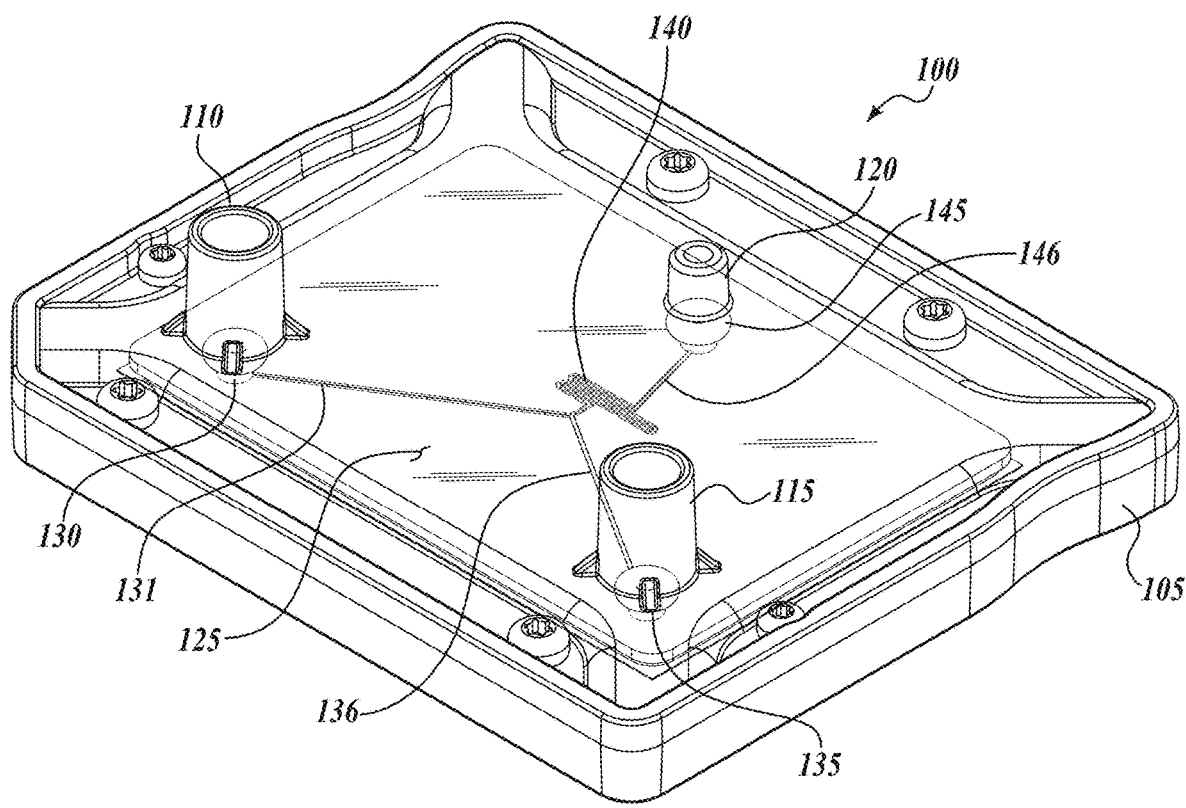
Figure 1C:
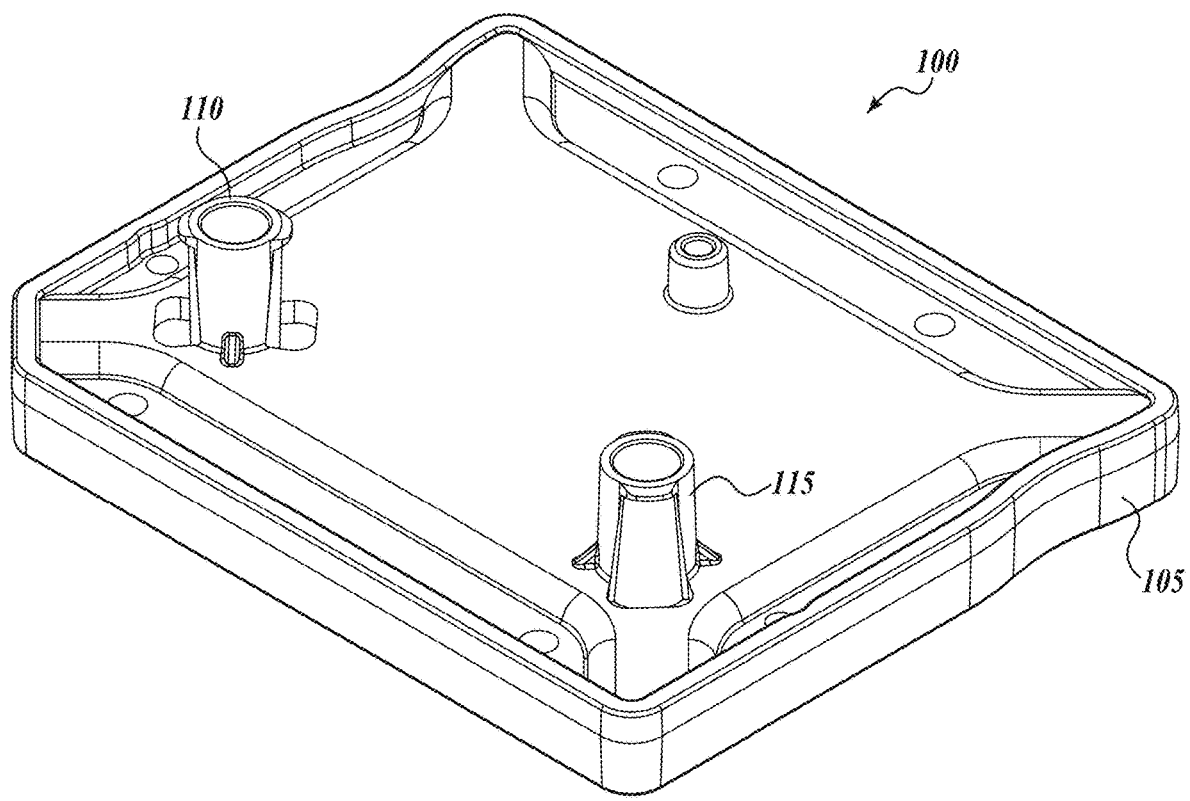

The illustrated inlet connectors 110 and 115 are in the form of tapered connectors, but it will be appreciated that any fluidic connector type can be used, including Luer-Lok connectors, as illustrated in FIG. 1C. In one embodiment, the inlet connectors 110 and 115 are Luer fittings designed to be compatible with ISO 594. The dimensions of the inlet connectors 110 and 115 may be optimized to reduce the internal volume. In one embodiment, the inlet connectors 110 and 115 provide a sterile or aseptic fluid path for the inlet fluid from the fluid vessel to the microfluidic structure 125.

The outlet opening 120 is configured to allow fluid to flow from the microfluidic cartridge 100 into an outlet receptacle. In one embodiment of the microfluidic cartridge, the outlet opening 120 is a nozzle that directs the fluid to a receptacle below. In one embodiment, the outlet opening 120 fitting provides a hermetic seal to the outlet receptacle. An example of such a fitting would be a Luer fitting compatible with ISO 594. In one embodiment, the outlet opening 120 provides a sterile or aseptic fluid path for the outlet stream from the microfluidic cartridge to the outlet receptacle.

While tapered connectors are illustrated in the FIGURES, it will be appreciated that any connection type can be used as long as fluid can be passed through the connector and into (or away from) the microfluidic structure 125. Accordingly, in another embodiment, the inlet connectors are gaskets (e.g., O-rings) configured to form a pressure seal with a connector to a source of fluid (e.g., a pump head) off of the cartridge 100. In a further embodiment, the gaskets are fitted in seating grooves formed in the surface of the microfluidic cartridge 100. In certain embodiment, the outlet connector is a gasket, similar to the previously described inlet connectors.

Referring to FIG. 1B, a microfluidic structure 125 is disposed within the carrier 105. In the illustrated embodiment, the microfluidic structure 125 is in the form of a chip that is distinct from the carrier 105. The microfluidic structure 125 includes a first inlet microchannel 130 configured to receive fluid (e.g., a first solution) from first inlet connector 110; and a second inlet microchannel 135 configured to receive fluid (e.g., a second solution) from the second inlet connector 115. A first mixer 140 is configured to receive flow from the first inlet microchannel 130 from a first transport microchannel 131 and from the second inlet microchannel 135 from a second transport microchannel 136. The first mixer is configured to mix two fluids to form a mixed solution and deliver the mixed solution to the outlet opening 120 via a third transport microchannel 146 and an outlet microchannel 145.

The first mixer 140 is a "microfluidic element," which is defined herein as a microfluidic component configured to perform a function beyond simply flowing solution, such as mixing, heating, filtering, reacting, etc. In several exemplary embodiments disclosed herein, the microfluidic elements described are microfluidic mixers configured to mix a first solution with a second solution in a mixer to provide a mixed solution. However, other microfluidic devices are also compatible with the disclosed embodiments.

While only a single microfluidic element (mixer 140) is illustrated, it will be appreciated that multiple microfluidic elements can be incorporated into the microfluidic cartridge 100. In certain embodiments, this includes a second mixer. Further inlet connections may also be added in order to support functions of the additional microfluidic elements. In one embodiment, a plurality of mixers (microfluidic elements) are included in the microfluidic structure.

For example, in another embodiment (not illustrated) a third inlet connection is included and a second mixer is included to perform a dilution of the mixed solution produced by the first mixer 140 by mixing a dilution solution provided via the third inlet connector.

The microfluidic structure 125 is integrally incorporated into the carrier 105. As used herein, the term "integrally incorporated" refers to a microfluidic structure that is not readily removable from the carrier. For example, a microfluidic structure is integrally incorporated into a carrier if the carrier is only openable—to expose the microfluidic structure—with a tool (e.g., a screwdriver used to unfasten securing screws). Additionally, a microfluidic structure is integrally incorporated into a carrier if the carrier is sealed shut, such that the microfluidic structure could only be removed by breaking the carrier. As a final example, a microfluidic structure is integrally incorporated into a carrier if the microfluidic structure is physically attached or part of the carrier (e.g., if the microfluidic cartridge is of monolithic construction or has been permanently adhered using an adhesive, solvent weld or other technique). Such a monolithic construction is not considered to incorporate a microfluidic chip, because the microfluidic structure is a part of an element of the carrier that provides a function besides microfluidic flow (e.g., structural support).

In a further embodiment, being integrally incorporated indicates that the microfluidic cartridge cannot be taken apart and put back together again. For example, the microfluidic structure cannot be removed from the carrier and then replaced and sealed.

The microfluidic cartridge 100 is disposable. As used herein the term "disposable" refers to a component that has relatively low cost in relation to the product produced by the microfluidic cartridge (e.g., nano-medicine). Furthermore, a disposable microfluidic cartridge has a limited useful life, such as only being fit for single use, as described below. Disposable materials broadly include plastics, magnets (e.g., inorganic materials), and metals.

In one embodiment, the microfluidic cartridge is configured for a single use. In this regard, the microfluidic cartridge is of a construction that results in low manufacturing cost and therefore allows a user to dispose of the cartridge after use. In certain embodiments, a property of the cartridge is altered after a single use, therefore discouraging or eliminating the possibility of further uses of the cartridge. For example, with regard to a sterile cartridge (as described below), after a single use the cartridge is no longer sterile and therefore would not be usable again as a sterile cartridge. Furthermore, a single use cartridge eliminates the risk of cross-contamination between mixings. In this regard, a single-use microfluidic cartridge contains an entirely unused (untouched by fluid) fluidic path, from inlet connectors to outlet. Existing chip/holder technologies risk cross contamination due to the inlet connectors and outlet being reused between mixings. As used herein, the term "chip" refers to a freestanding microfluidic layer that is subsequently integrated into a holder containing inlet/outlet connections. The disclosed microfluidic cartridges are distinct from such chip/holder systems by integrally incorporating a microfluidic structure—which is a chip in certain embodiments, but is not a chip in other embodiments.

In one embodiment, the carrier comprises a first portion, comprising the first inlet connector, the second inlet connector, and the outlet opening and a second portion, wherein the first portion and the second portion join to seal the microfluidic structure between the first portion and the second portion. In certain embodiments herein, the first portion of the carrier may be referred to as the connection portion and the second portion may be referred to as the top plate. Certain embodiments may require the use of additional components, such as screws and plates, to complete the coupling between the first and second portions of the carrier. In one embodiment, referring to FIG. 2, the second portion 150 serves to apply a clamping force to the assembly. In one embodiment, the second portion 150 contains a layer or mechanism to evenly distribute clamping forces across the microfluidic structure.

Figure 2:
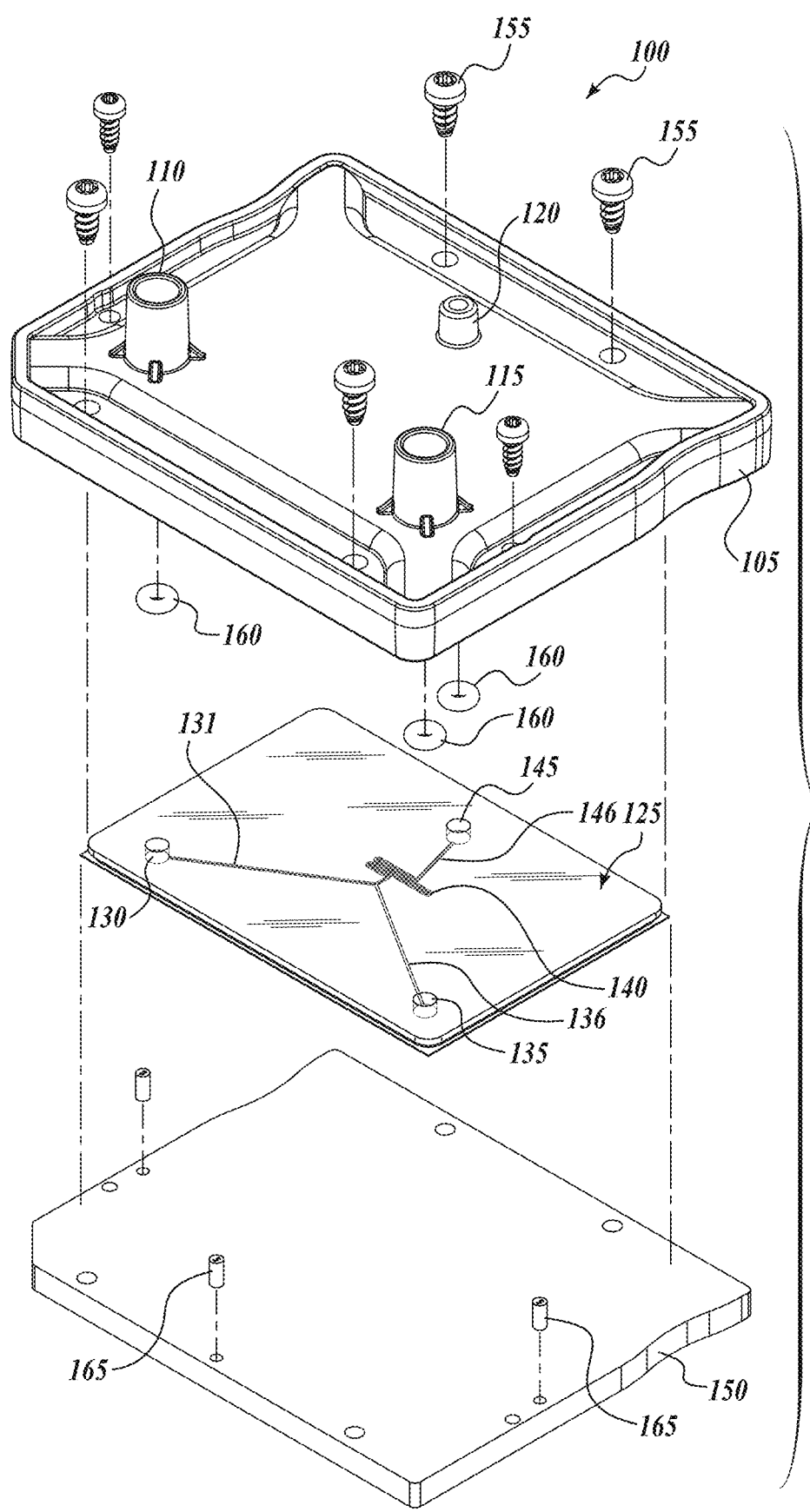
FIGS. 2 and 3 are exploded views of the microfluidic cartridge of FIGS. 1A and 1B.
Figure 3:
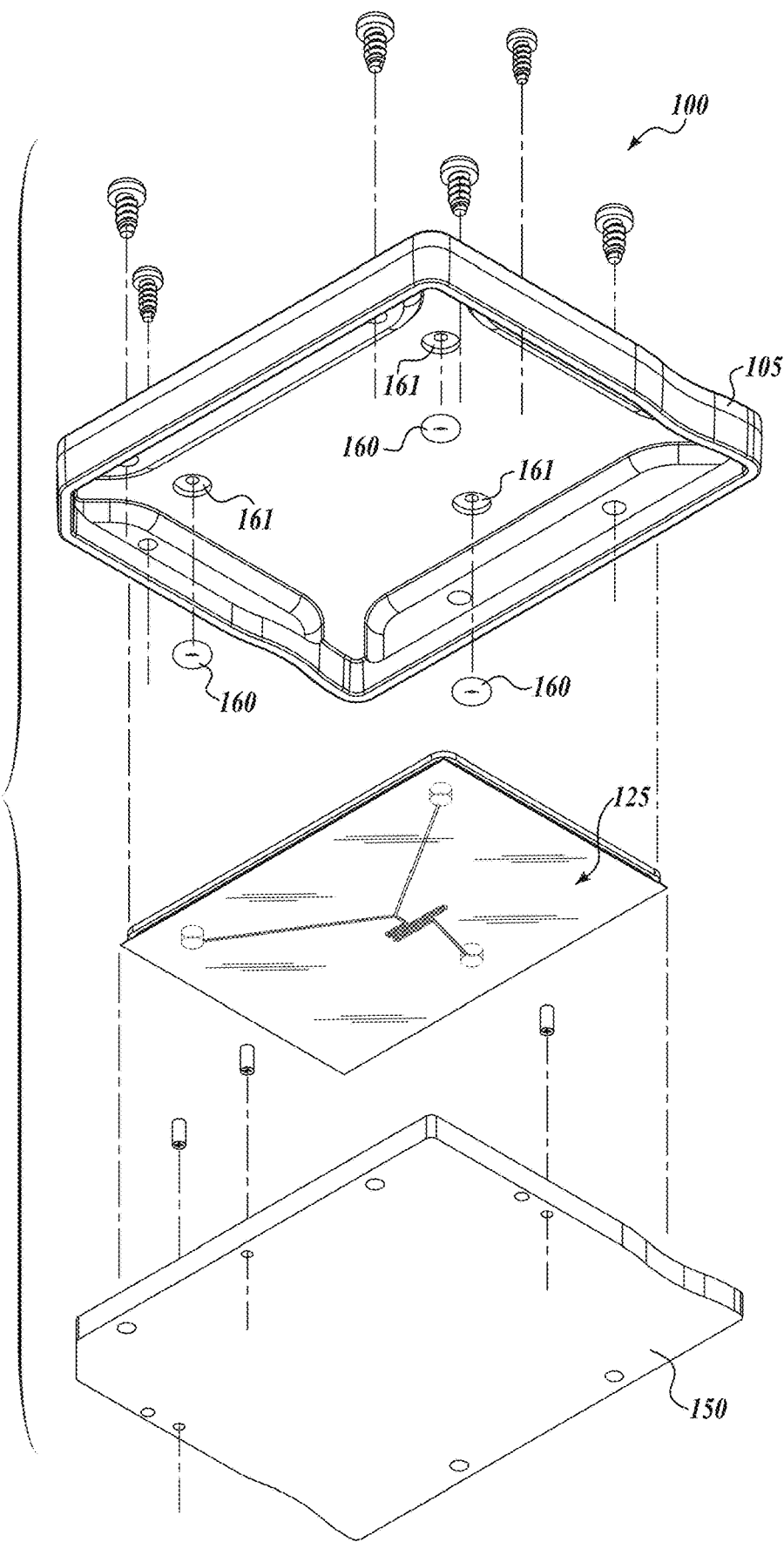

Referring now to FIGS. 2 and 3, a representative embodiment of a microfluidic cartridge is illustrated in exploded view in order to more easily view how the microfluidic cartridge is assembled. In the illustrated embodiment, the carrier 105 is split into two portions, with the carrier 105 being a first portion that joins with a second portion 150 to seal the microfluidic structure 125 therebetween. The two carrier portions 105 and 150 are integrally joined by a plurality of fasteners 155 (illustrated as screws).

Accordingly, in one embodiment, the first portion and the second portion of the carrier are secured together by one or more fasteners. In one embodiment, the one or more fasteners are removable. Exemplary removable fasteners are screws, nuts and bolts, clips, straps, and pins.

In another embodiment, the one or more fasteners are not removable. In such embodiments, the fasteners may be nails or rivets. In an additional embodiment, such fasteners may be incorporated as a feature of the carrier. In such and embodiment, one portion may contain clips or tabs with a second portion having recesses, notches or other mechanisms to receive such a fastener.

In another embodiment, the first portion and the second portion are bonded together. In such embodiments, the two portions are not separable once joined. In one embodiment, the first portion and the second portion are bonded together with an adhesive. In one embodiment, the first portion and the second portion are bonded together with a weld. Representative compatible welding methods include laser welding, ultrasonic welding, and solvent welding.

Referring again to FIGS. 2 and 3, the microfluidic cartridge further includes gaskets 160 configured to form separate fluid-tight seals between the microfluidic structure 125 and the first inlet connector 110, the second inlet connector 115, and the outlet opening 125. As illustrated in FIG. 3, the gaskets 160 are nested in recesses 161 in the first portion of the carrier 105. While gaskets in the form of O-rings are illustrated, in certain embodiments, flanges or other feature integrated into the carrier 105 are utilized to form the required seal.

Securing Mechanism

In one embodiment, the microfluidic cartridge further includes a securing mechanism configured to secure the microfluidic cartridge to a holder. In one embodiment the holder is an apparatus configured to arrange the microfluidic cartridge in relation to fluid sources (e.g., syringes) and to facilitate connections between them. An exemplary holder is illustrated or pictured in FIGS. 5A, 5C, and 5H, as will be discussed in further detail below.

In the embodiment illustrated in FIGS. 2 and 3, the securing mechanism comprises multiple magnets 165 placed in recesses within the carrier 105. The magnets 165 attract to metal or opposite magnets on the holder in order to secure the microfluidic cartridge 100 for use.

In another embodiment, the securing mechanism comprises a carrier locking feature on the carrier that is configured to lock with a holder locking feature on a compatible holder for the microfluidic cartridge. Such a holder locking feature may include a recess in the carrier that mates with or is otherwise secured by an arm or other projection attached to the holder. An example of such a locking feature would be a leaf spring with a matching recess.

Cartridge Materials and Construction

The carrier and microfluidic structure are formed from materials capable of being formed into the necessary shapes and with the necessary physical characteristics. The materials are disposable and therefore relatively inexpensive. The material of the microfluidic structure is capable of being formed into the necessary micron-sized microfluidic elements and then withstanding the pressures applied during mixing within the microfluidic structure. The material of the carrier is sufficiently rigid that it will protect and support the microfluidic structure within the carrier.

In one embodiment, the microfluidic structure is formed from a material different than that of the carrier. In another embodiment, the microfluidic structure and the carrier are formed from the same material. In a further embodiment, the microfluidic structure and the carrier are monolithically formed.

In one embodiment, the carrier contains no metal. In another embodiment, the carrier may contain some metal, but the carrier is at least 90%, by weight, polymer. In one embodiment, the carrier contains no metal. In another embodiment, the carrier may contain some metal, but the carrier is at least 99%, by weight, polymer.

In one embodiment, the carrier comprises a polymer selected from the group consisting of polypropylene, polycarbonate, COC, COP, polystyrene, nylon, acrylic, HPDE, LPDE, and other polyolefins.

In one embodiment, the carrier does not include metal on an exterior surface. Such an embodiment contemplates the potential presence of magnets or other metal-containing elements within the carrier, but not on the exterior surface. In another embodiment, the first inlet connector and the second inlet connector are formed from a polymer. In certain embodiments it is preferable that the inlet connectors be formed from relatively soft polymer material, particularly when a taper or Luer connector is used. A softer polymer will ameliorate minor manufacturing errors of the inlets and allow a fluid-tight connection to be made. More rigid polymers will not allow for such a forgiving characteristic. In this regard, in one embodiment, the first inlet connector comprises a polymer having a Young's modulus of 500 MPa to 3500 MPa. In one embodiment, the first inlet connector comprises a polymer having a Young's modulus of 2000 MPa to 3000 MPa.

In one embodiment, the second inlet connector comprises a polymer having a Young's modulus of 500 MPa to 3500 MPa. In one embodiment, the second inlet connector comprises a polymer having a Young's modulus of 2000 MPa to 3000 MPa.

In one embodiment, the carrier is formed from a polymer having a Young's modulus of 500 MPa to 3500 MPa. In one embodiment, the carrier comprises a polymer having a Young's modulus of 2000 MPa to 3000 MPa.

In one embodiment, the carrier comprises a metal selected from the group consisting of aluminum and steel. As noted above, in certain embodiments, small amounts of metal can be incorporated into the carrier. In such a situation, the microfluidic cartridge remains disposable.

In one embodiment, the microfluidic structure is not separable from the carrier. In such an embodiment, the microfluidic structure is attached (e.g., welded or adhered to) at least a portion of the carrier. In one embodiment the microfluidic cartridge is monolithic in construction, with the carrier and microfluidic structure being formed from the same material. In a further embodiment, the microfluidic cartridge is composed of at least two parts (e.g., a connection portion and a top plate) with the microfluidic structure being incorporated into one of the two parts. That is, the microfluidic structure is attached (e.g., bonded or welded to) to a portion of the microfluidic cartridge that performs an addition function beyond providing microfluidic elements. In one embodiment the microfluidic structure is attached to the top plate. In a further embodiment, the microfluidic structure and the top plate are monolithic and formed from the same material. In yet a further embodiment, the microfluidic structure is of monolithic construction with one of the two parts.

In one embodiment, the carrier encloses the microfluidic structure. As used herein, the term "encloses" indicates that the carrier surrounds a majority of the surface area of the microfluidic structure. Of primary importance is that the carrier facilitates a fluid-tight seal with the microfluidic structure and provide a rigid housing that allows for handling of the microfluidic cartridge. In a further embodiment, the carrier entirely encloses the microfluidic structure, meaning that no surface area of the microfluidic structure is exposed outside the carrier. Such an embodiment is illustrated in FIGS. 1A-3.

In one embodiment, the first portion and the second portion join to enclose the microfluidic structure. Such an embodiment is illustrated in FIGS. 2 and 3.

In one embodiment, the first portion is at least 90%, by weight, polymer. In this embodiment, the first portion includes the inlet connectors and outlet opening.

In one embodiment, the first portion or the second portion comprises the microfluidic structure. In such an embodiment, the microfluidic structure is attached to, or monolithic with, the first portion or the second portion of the carrier.

Fluid Sources

The fluid or solution reservoirs are selected such as to allow a direct connection to the microfluidic cartridge. In one embodiment, the fluid reservoirs are disposable syringes. In a further embodiment, the fluid reservoirs are prefilled syringes. Both the fluid and the reservoir may be sterile in order to produce sterile nanoparticles. The system contains a means by which to cause the fluid to flow from the reservoir and through the cartridge at a prescribed flow rate. In one embodiment of the system, the fluid is caused to flow by pressurizing the reservoirs causing a first and second stream to enter the cartridge (through the inlets into the microfluidic structure and its channels). Examples of means of pressurization include, but are not limited to, linear actuators and inert gas. In one embodiment, each reservoir is pressurized independently. In one embodiment, two or more reservoirs are pressurized by the same source and differential flow rates are achieved by varying the dimensions of the fluidic channels. Differing flow ratios may be enabled by either differential pressure drops across the flow channels, differential channel impedances, or combination therein, applied to the inlet streams. Differential impedances of the channels through varying the channel heights, widths, lengths, or surface properties, may be used to achieve different flow rates. Fluidic surface tensions, viscosities, and other surface properties of the flows in the one or more first streams and the one or more second streams may be used or considered to achieve different flow rates. Pressurization of the vessels may be controlled using a computer or microcontroller.

In certain embodiments, the system further includes means for complete or partial purging of the system to minimize the waste volume. After or during manufacture of particles, purging may be achieved by flowing a gas or liquid through the fittings and microfluidic structure. Gasses such as air, nitrogen, argon or others may be used. Liquids including water, aqueous buffer, ethanol, oils, or any other liquid may be used.

Microfluidic Mixers

In one embodiment, the first mixer comprises a mixing region comprising a microfluidic mixer configured to mix the first solution and the second solution to provide a mixed solution. Such microfluidic mixers are generally known to those of skill in the art and exemplary mixers are disclosed in the patent documents incorporated herein by reference.

In one embodiment, the first mixer is a chaotic advection mixer.

In one embodiment, the mixing region comprises a herringbone mixer.

In one embodiment, the mixing region has a hydrodynamic diameter of about 20 microns to about 300 microns.

In one embodiment, the first mixer is sized and configured to mix the first solution and the second solution at a Reynolds number of less than 1000.

In one embodiment, the microfluidic structure further comprises a plurality of mixers in series.

In certain aspects, the disposable cartridge contains a microfluidic component which is a microfluidic mixer to rapidly and controllably mix two or more streams. Many methods for this mixing process are known. In one embodiment, the mixing is chaotic advection. Compatible microfluidic mixing methods and devices are disclosed in the patent applications incorporated herein by reference. Furthermore, representative microfluidic devices are disclosed in further detail herein. In certain embodiments, devices are provided for making nanoparticles of the type disclosed herein. The microfluidic devices are incorporated into the disposable cartridge and methods disclosed herein.

Figure 4A:
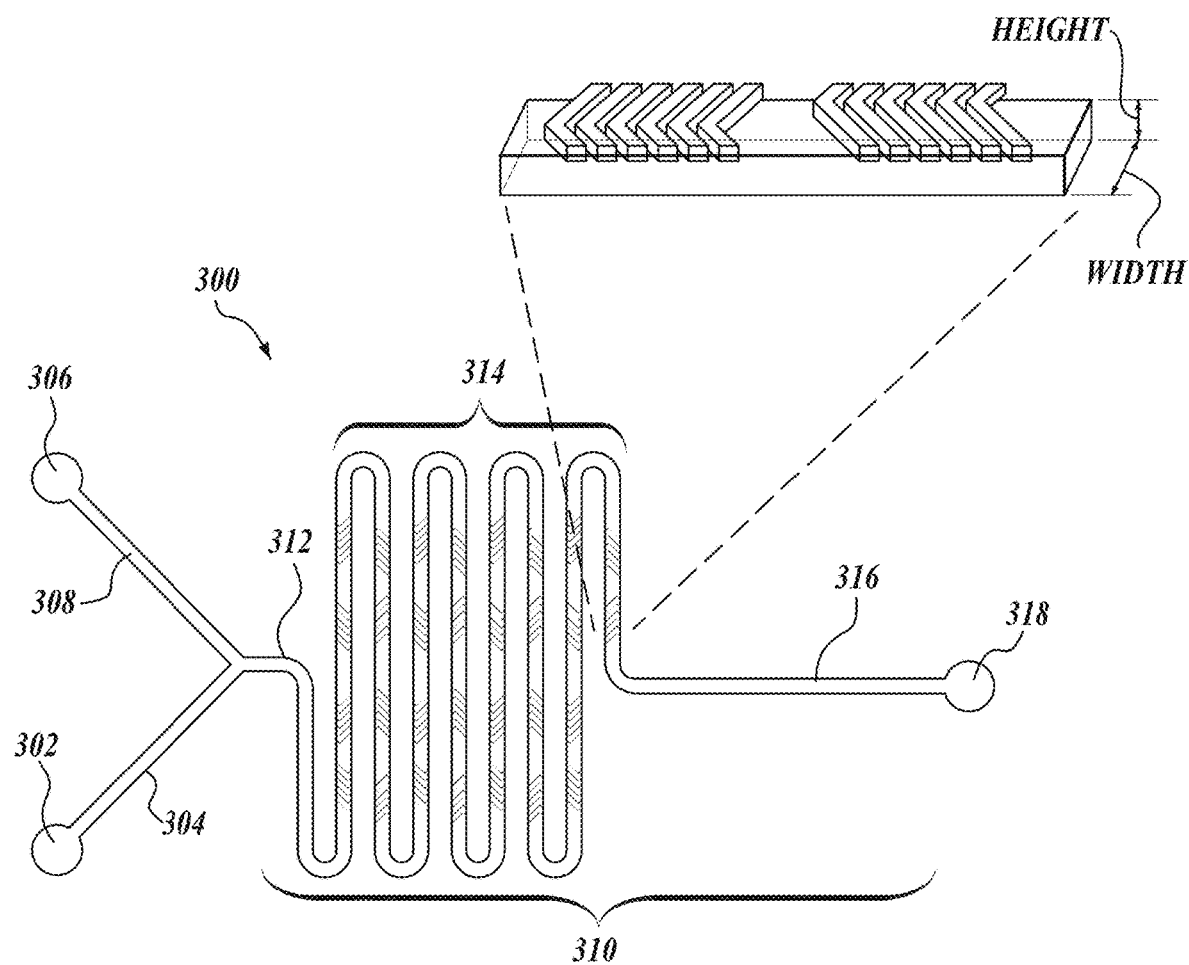
FIG. 4A is a schematic illustration of a staggered herringbone mixer of the type incorporated in a microfluidic cartridge in accordance with certain embodiments disclosed herein.

In one embodiment, with reference to FIG. 4, the microfluidic structure includes:

(a) a first inlet 302 for receiving a first solution comprising a first solvent;

(b) a first inlet microchannel 304 in fluid communication with the first inlet to provide a first stream comprising the first solvent;

(c) a second inlet 306 for receiving a second solution comprising lipid particle-forming materials in a second solvent;

(d) a second inlet microchannel 308 in fluid communication with the second inlet to provide a second stream comprising the lipid particle-forming materials in the second solvent; and (e) a third microchannel 310 for receiving the first and second streams, wherein the third microchannel has a first region 312 adapted for flowing the first and second streams and a second region 314 adapted for mixing the contents of the first and second streams to provide a third stream comprising a mixed solution. In one application of the microfluidic cartridge, the mixed solution comprises limit size lipid nanoparticles. The lipid nanoparticles so formed are conducted from the second (mixing) region by microchannel 316 to outlet 318.

In one embodiment, the second region of the microchannel comprises bas-relief structures. In certain embodiments, the second region of the microchannel has a principal flow direction and one or more surfaces having at least one groove or protrusion defined therein, the groove or protrusion having an orientation that forms an angle with the principal direction. In other embodiments, the second region includes a micromixer.

In the devices and systems, means for varying the flow rates of the first and second streams are used to rapidly mix the streams thereby providing the nanoparticles.

In certain embodiments, the devices of the disclosure provide complete mixing occurs in less than 10 ms.

In certain embodiments, one or more regions of the device are heated.

In one embodiment, the first mixer comprises a mixing region comprising a microfluidic mixer configured to mix the first solution and the second solution to provide the nanoparticle solution formed from mixing of the first solution and the second solution.

In one embodiment, the first mixer is a chaotic advection mixer.

In one embodiment, the mixing region comprises a herringbone mixer.

While a staggered herringbone mixer (SHM) is illustrated in certain FIGURES (e.g., FIG. 4A), it will be appreciated that other mixing configurations are also contemplated. In one embodiment, the mixer is a dean vortexing mixer. In another embodiment, the mixer is a Dean vortex bifurcating mixer (DVBM), which are discussed in greater detail below. In one embodiment, the microfluidic structure includes two different types of chaotic advection mixers. In a further embodiment, the two different types of chaotic advection mixers are SHM and Dean vortexing. In one embodiment, the microfluidic structure includes two different types of chaotic advection mixers, wherein at least one of the two chaotic advection mixers is selected from the group consisting of SHM and Dean vortexing.

In one embodiment, the mixing region has a hydrodynamic diameter of about 20 microns to about 300 microns. In one embodiment, the mixing region has a hydrodynamic diameter of about 113 microns to about 181 microns. In one embodiment, the mixing region has a hydrodynamic diameter of about 150 microns to about 300 microns. As used herein, hydrodynamic diameter is defined using channel width and height dimensions as (2*Width*Height)/(Width+Height).

The mixing region can also be defined using standard width and height measurements. In one embodiment, the mixing region has a width of about 100 to about 500 microns and a height of about 50 to about 200 microns. In one embodiment, the mixing region has a width of about 200 to about 400 microns and a height of about 100 to about 150 microns.

In order to maintain laminar flow and keep the behavior of solutions in the microfluidic devices predictable and the methods repeatable, the systems are designed to support flow at low Reynolds numbers. In one embodiment, the first mixer is sized and configured to mix the first solution and the second solution at a Reynolds number of less than 2000. In one embodiment, the first mixer is sized and configured to mix the first solution and the second solution at a Reynolds number of less than 1000. In one embodiment, the first mixer is sized and configured to mix the first solution and the second solution at a Reynolds number of less than 900. In one embodiment, the first mixer is sized and configured to mix the first solution and the second solution at a Reynolds number of less than 500.

In one embodiment, the microfluidic mixer device contains one micromixer. In one embodiment, the single mixer microfluidic device has two regions: a first region for receiving and flowing at least two streams (e.g., one or more first streams and one or more second streams). The contents of the first and second streams are mixed in the microchannels of the second region, wherein the microchannels of the first and second regions has a hydrodynamic diameter from about 20 to about 500 microns. In a further embodiment, the second region of the microchannel has a principal flow direction and one or more surfaces having at least one groove or protrusion defined therein, the groove or protrusion having an orientation that forms an angle with the principal direction (e.g., a staggered herringbone mixer), as described in US 2004/0262223, expressly incorporated herein by reference in its entirety. In one embodiment, the second region of the microchannel comprises bas-relief structures. In certain embodiments, the second regions each have a fluid flow rate of from 1 to about 50 mL/min. In a preferred embodiment, the mixing channel of the microfluidic device is 300 microns wide and 130 microns high. In other embodiments, the first and second streams are mixed with other micromixers. Suitable micromixers include droplet mixers, T-mixers, zigzag mixers, mulitlaminate mixers, or other active mixers.

One function of the systems and methods disclosed herein is to form nanoparticles in solution (the "product"). Previous disclosures by the present inventors relate to generating nanoparticles compatible with the present system, such as the patent applications incorporated herein by reference. Known and future-developed nanoparticle methods can be performed on the disclosed systems to the extent that the methods require the controlled combination of a first solution with a second solution to form a nanoparticle product, as disclosed herein.

The first solution, also referred to herein as the "aqueous reagent" herein, is provided in a first solution reservoir. In one embodiment, the first solution comprises a first solvent. In one embodiment, the first solution comprises an active pharmaceutical ingredient. In one embodiment, the first solution comprises a nucleic acid in a first solvent. In another embodiment, the first solution comprises a buffer. In one embodiment, the first solution consists essentially of a buffer.

The second solution, also referred to herein as the "solvent reagent" herein, is provided in a second solution reservoir. In one embodiment, the second solution comprises a second solvent. In one embodiment, the second solution comprises lipid particle-forming materials in a second solvent. In one embodiment, the second solvent is a water-miscible solvent (e.g., ethanol or acetonitrile). In certain embodiments, the second solution is an aqueous buffer comprising polymer nanoparticle forming reagents.

In one embodiment, the first solution comprises a nucleic acid in a first solvent and the second solution comprises lipid particle-forming materials in a second solvent.

Dean Vortex Bifurcating Mixers ("DVBM")

As noted above, DVBM are useful as mixers in the disclosed microfluidic cartridges. DVBMs of the type disclosed herein act as efficient mixers and whose injection molding tooling can be produced by an end mill with a radius of R (for example 300 μm). The provided DVBM mixers include a plurality of toroidal mixing elements (also referred to herein as "toroidal mixers"). As used herein, "toroid" refers to a generally circular structure having two "leg" channels that define a circumference of the toroid between an inlet and an outlet of the toroidal mixer. The toroidal mixers are circular in certain embodiments. In other embodiments, the toroidal mixers are not perfectly circular and may instead have oval or non-regular shape.

Figure 4B:
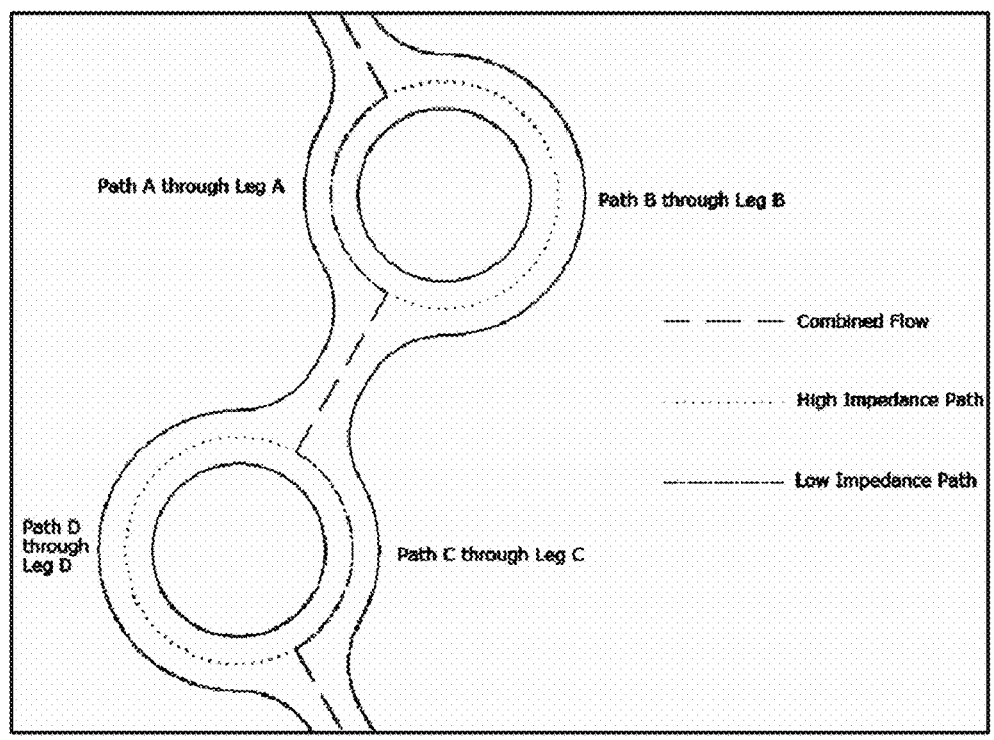
FIG. 4B is a schematic illustration of a toroidal pair Dean vortex bifurcating mixers (DVBM) in accordance with the disclosed embodiments.
Figure 4C:
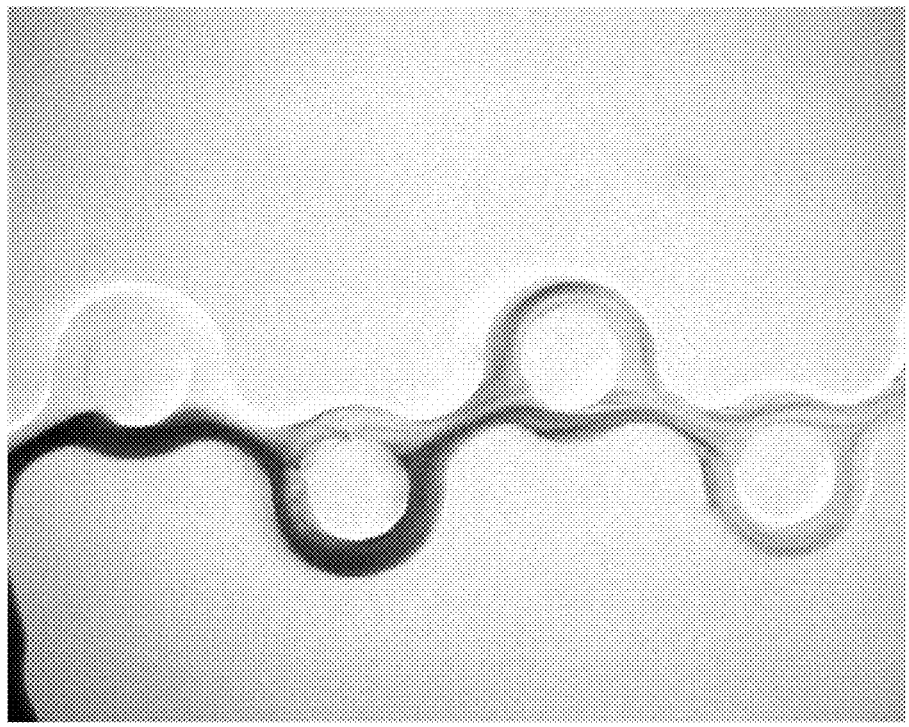
FIG. 4C is a photograph of an exemplary toroidal DVBM mixer, mixing two solutions, in accordance with the disclosed embodiments.

FIG. 4B illustrates a pair of toroidal DVBM mixers in accordance with the disclosed embodiments. FIG. 4C is a photograph of an exemplary toroidal DVBM mixer in accordance with the disclosed embodiments.

In one embodiment, the DVBM mixer is configured to mix at least a first liquid and a second liquid, the mixer comprising an inlet channel leading into a plurality of toroidal mixing elements arranged in series, wherein the plurality of toroidal mixing elements includes a first toroidal mixing element downstream of the inlet channel, and a second toroidal mixing element in fluidic communication with the first toroidal mixing element via a first neck region, and wherein the first toroidal mixing element defines a first neck angle between the inlet channel and the first neck region.

In one embodiment, the first neck angle is from 0 to 180 degrees.

In one embodiment, the first neck region has a length of 0.2 mm or greater.

In one embodiment, the plurality of mixing elements include channels having a hydrodynamic diameter of about 20 microns to about 2 mm.

In one embodiment, the mixer is sized and configured to mix the first liquid and the second liquid at a Reynolds number of less than 1000.

In one embodiment, the mixer includes two or more mixers in parallel, each mixer having a plurality of toroidal mixing elements.

In one embodiment, the first toroidal mixing element and the second toroidal mixing element define a mixing pair, and wherein the mixer includes a plurality of mixing pairs, and wherein each mixing pair is joined by a neck region at a neck angle.

In one embodiment, the first toroidal mixing element has a first leg of a first length and a second leg of a second length; and wherein the second toroidal mixing element has a first leg of a third length and a second leg of a fourth length.

In one embodiment, the first length is greater than the second length.

In one embodiment, the third length is greater than the fourth length.

In one embodiment, the ratio of the first length to the second length is about equal to the ratio of the third length to the fourth length.

In one embodiment, the first toroidal mixing element has a first leg of a first impedance and a second leg of a second impedance; and wherein the second toroidal mixing element has a first leg of a third impedance and a second leg of a fourth impedance.

In one embodiment, the first impedance is greater than the second impedance.

In one embodiment, the third impedance is greater than the fourth impedance.

In one embodiment, the ratio of the first impedance to the second impedance is about equal to the ratio of the third impedance to the fourth impedance.

In one embodiment, the mixer includes 2 to 20 toroidal mixing elements in series.

In one embodiment, the mixer includes 1 to 10 pairs of toroidal mixing elements in series.

In one embodiment, the toroidal mixing elements have an inner radius of about 0.1 mm to about 2 mm.

Also provided are methods of mixing a first liquid with a second liquid using a microfluidic cartridge as disclosed herein, the method comprising flowing the first liquid and the second liquid through a DVBM mixer according to the disclosed embodiments.

Sterility

A sterile cartridge is essential for certain applications and provides a convenient workflow for users to directly formulate sterile nanoparticles without the need for further filtration or treatment. Such a workflow minimizes the material loss associated with further sterilization steps. In one embodiment, the individual components of the cartridge are sterilized prior to assembly. Representative sterilization methods include steam autoclave, dry heat, chemical sterilization (i.e. sodium hydroxide or ethylene oxide), gamma radiation, gas and combinations thereof. In a specific embodiment, the microfluidic structure, inlet fittings, outlet fitting and any other fluid contact components are formed from materials that are compatible with gamma radiation and are sterilized by such means. Materials compatible with gamma radiation are those that can be irradiated. For example, polycarbonate, cyclic olefin polymer, cyclic olefin copolymer, polypropylene, and high- and low-density polyethylene. Materials that cannot be irradiated include polyamides, polytetrafluoroethylene, and any metal. In a further embodiment, the cartridge is sterilized after assembly.

In one embodiment, the cartridge is sterilizable. As used herein, the term "sterilizable" refers to a cartridge formed from materials that are compatible with known sterilization methods, as set forth above. In one embodiment, the cartridge is specifically sterilizable by gamma radiation. In a further embodiment, the cartridge is formed from a polymer selected from the group consisting of polypropylene, polycarbonate, a cyclic olefin polymer, a cyclic olefin copolymer, high-density polyethylene, low-density polyethylene, and combinations thereof. In a further embodiment, the cartridge does not include polyamides, polytetrafluoroethylene, or any metal.

In one embodiment, the microfluidic cartridge is sterile.

In one embodiment, the microfluidic cartridge includes a sterile fluid path, from the first inlet connector and the second inlet connector, through the microfluidic structure, and to the outlet opening. Such a sterile fluid path allows for mixing in a sterile environment. Because the inlet connectors and outlet opening are also sterile, sterile connections can be easily facilitated.

In another aspect, a sterile package filled with sterile contents is provided. In one embodiment, the sterile package includes a microfluidic cartridge according to any of the embodiments disclosed herein in a sterile state and sealed within the sterile package. A sterile package is defined by an enclosure containing sterile contents. The enclosure is a bag in one embodiment. By providing the microfluidic cartridge in a sterile state and sealed within the sterile package, an end user can easily perform sterile microfluidic mixing using the cartridge by opening the sterile package in a sterile environment and using it for mixing without any further preparation. No sterilization is needed for any of the inlet connectors or the fluid path, which are sterile.

In one embodiment, the sterile package further includes a first sterile syringe configured to couple with the first inlet connector of the microfluidic cartridge. In such an embodiment, the sterile package is a kit that includes both the microfluidic cartridge and a sterile syringe configured for use with the microfluidic cartridge. In one embodiment, the sterile package further includes a first solution within the first sterile syringe.

In one embodiment, the first solution comprises a nucleic acid in a first solvent. In a further embodiment, the first solution is of the type configured for use to form lipid nanoparticles.

In one embodiment, the sterile package further includes a second sterile syringe configured to couple with the second inlet connector of the microfluidic cartridge.

In one embodiment, the sterile package further includes a second solution within the second sterile syringe.

In one embodiment, the second solution comprises lipid particle-forming materials in a second solvent. Such a second solution can be combined with a first solution comprising a nucleic acid in a first solvent in order to form a lipid nanoparticle solution via the microfluidic cartridge.

In one embodiment, the sterile package further includes a sterile receptacle configured to couple with the outlet opening of the microfluidic cartridge via an outlet opening connector.

In one embodiment, the sterile contents are disposable.

Methods of Using the Microfluidic Cartridge

In another aspect, a method of forming nanoparticles is provided. In one embodiment, the method includes flowing a first solution and a second solution through a microfluidic cartridge according to any of the disclosed embodiments and forming a nanoparticle solution in the first mixer.

Methods of forming nanoparticles using microfluidic mixers is generally known in the art and these methods are applicable to the disclosed microfluidic cartridges, which essentially provide an improved and simplified manner for performing known methods. Exemplary methods are disclosed in the patent documents incorporated herein by reference. The Example below describes a specific method for generating siRNA lipid nanoparticles using an exemplary microfluidic cartridge.

In one embodiment, the first solution comprises a nucleic acid in a first solvent.

In one embodiment, the second solution comprises lipid particle-forming materials in a second solvent.

In one embodiment, the microfluidic cartridge comprises a plurality of mixers and the method further comprises flowing the first solution and the second solution through the plurality of mixers to form the nanoparticle solution, wherein the plurality of mixers includes the first mixer. Such embodiments contemplate the introduction of a third solution for dilution of the mixed solution (e.g., to stabilize a lipid nanoparticle solution formed in the first mixer). Another representative use of a third, or subsequent, mixer, is the addition of further components to the mixed solution, such as a targeting ligand for a lipid nanoparticle that has already been created in the first mixer.

Figure 5A:
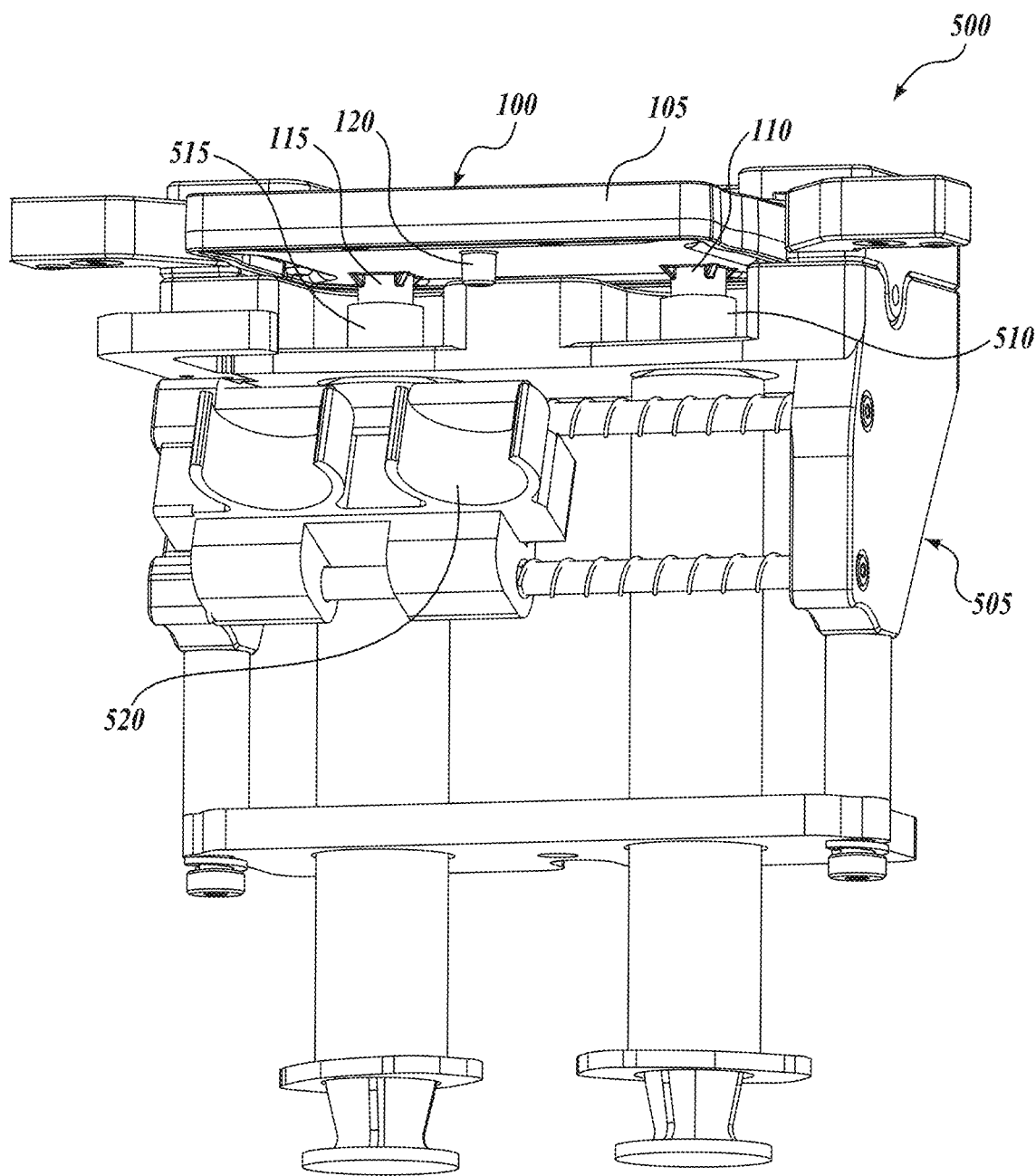
FIG. 5A illustrates a microfluidic cartridge connected to solution reservoirs (syringes) with the aid of a holder, in accordance with embodiments disclosed herein.
Figure 5B:
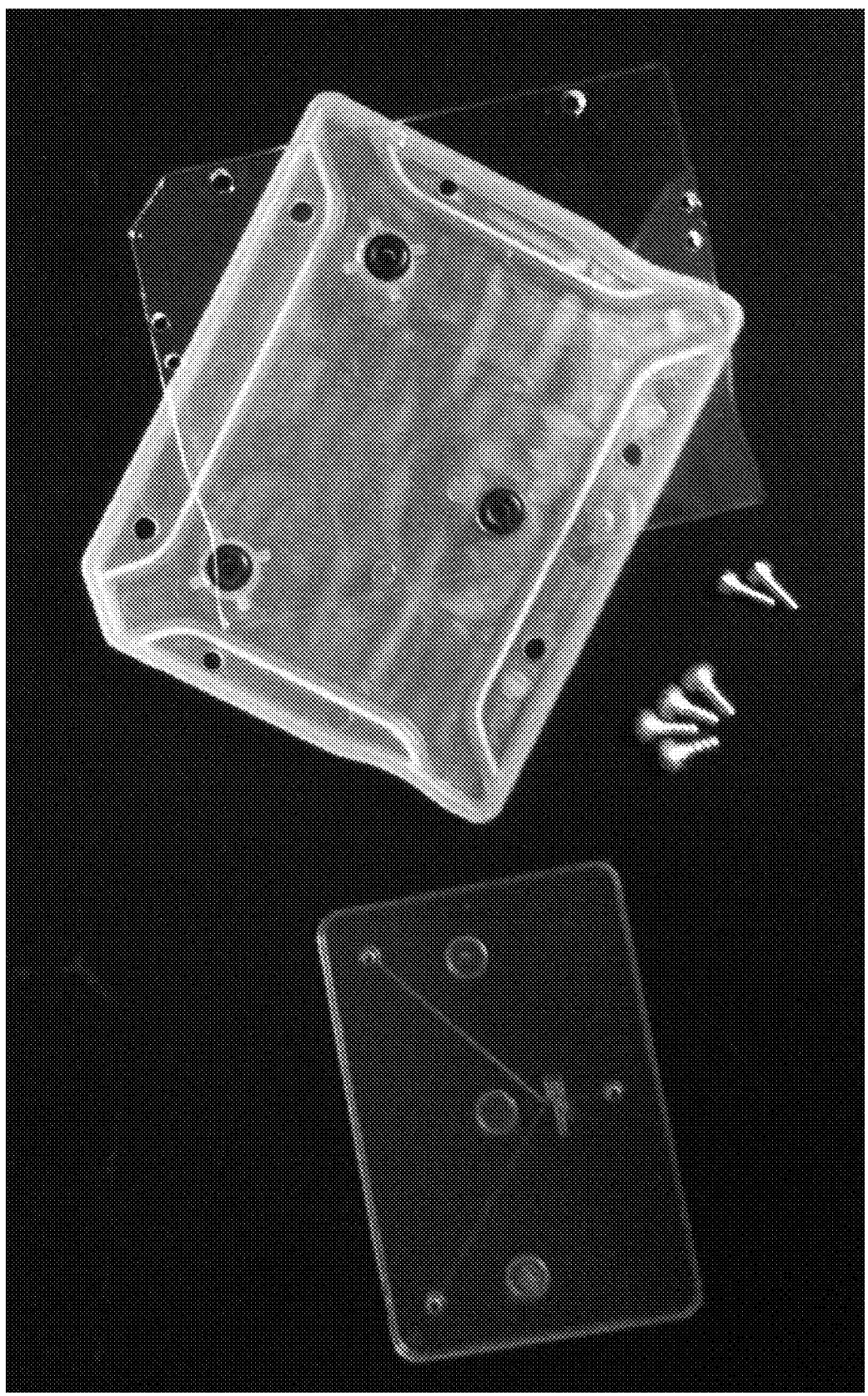
FIGS. 5B-5H are photographs depicting exemplary microfluidic cartridges in accordance with embodiments disclosed herein.

The disclosed methods can be facilitated by an apparatus for holding and/or manipulating the microfluidic cartridge. In this regard, FIG. 5A illustrates an embodiment of microfluidic system 500 that includes a cartridge holder 505 configured to facilitate connections between a microfluidic cartridge 100, specifically inlet connectors 110 and 115, and syringes 510 and 515, respectively, in order to mix solutions contained therein and deliver the mixed solution to the outlet opening 120 of the microfluidic cartridge 100. In the illustrated embodiment, a clamp 520 is provided to support a collection vial (not illustrated) to collect mixed solution produced at the outlet opening 120.

The holder 505 includes a mechanism (not illustrated) for securing the cartridge 100. Such securing mechanisms are disclosed elsewhere herein and include magnets within the cartridge 100 (see part 165 in FIGS. 2 and 3) configured to produce magnetic attraction to a portion of the holder 505 sufficient to immobilize the cartridge 100 in position.

Figure 5C:
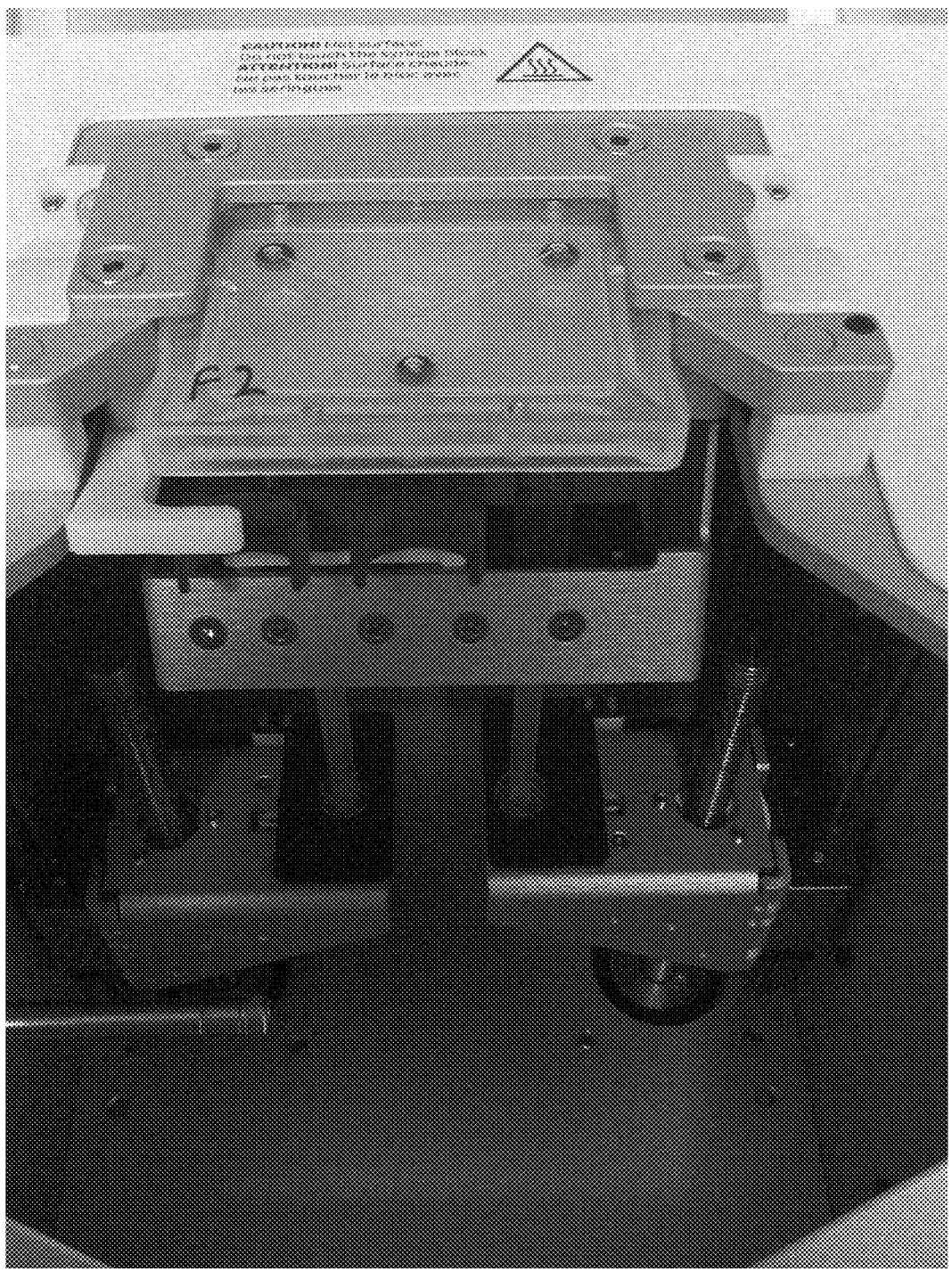
Figure 5D:
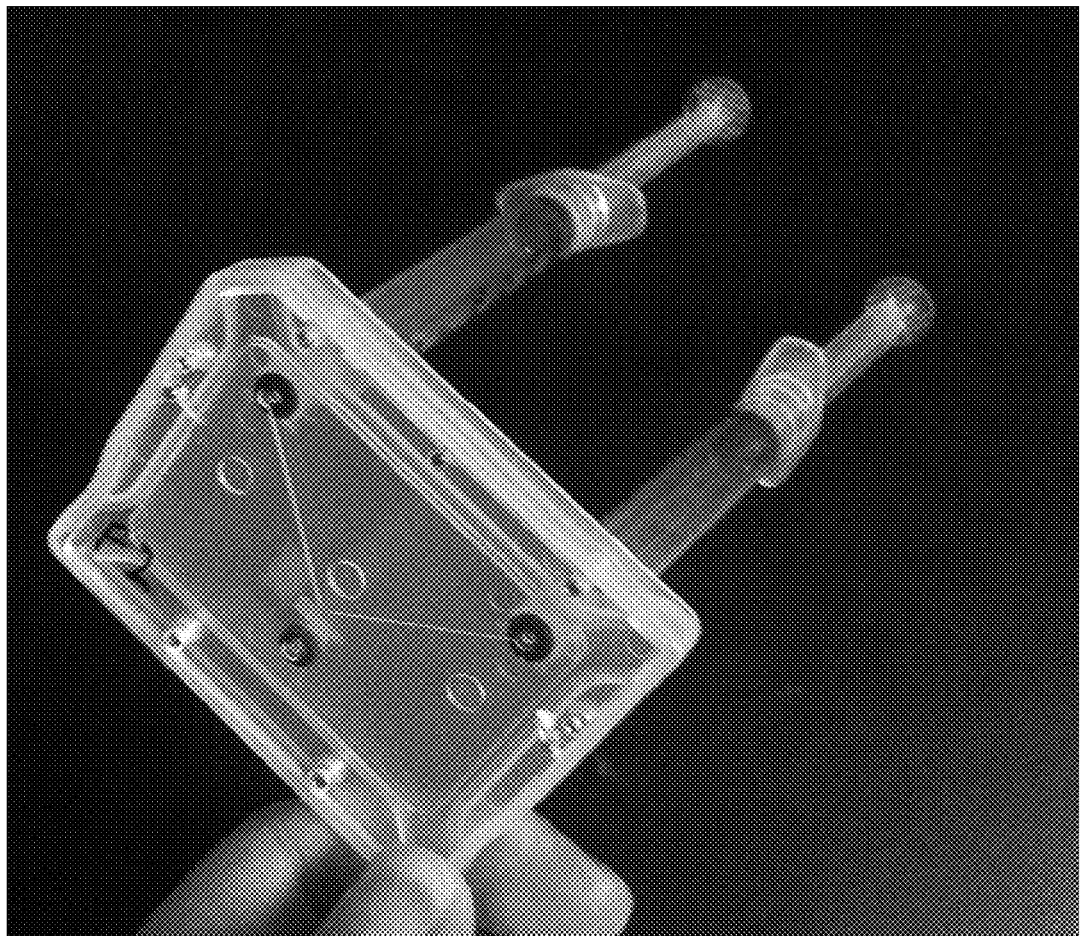
Figure 5E:
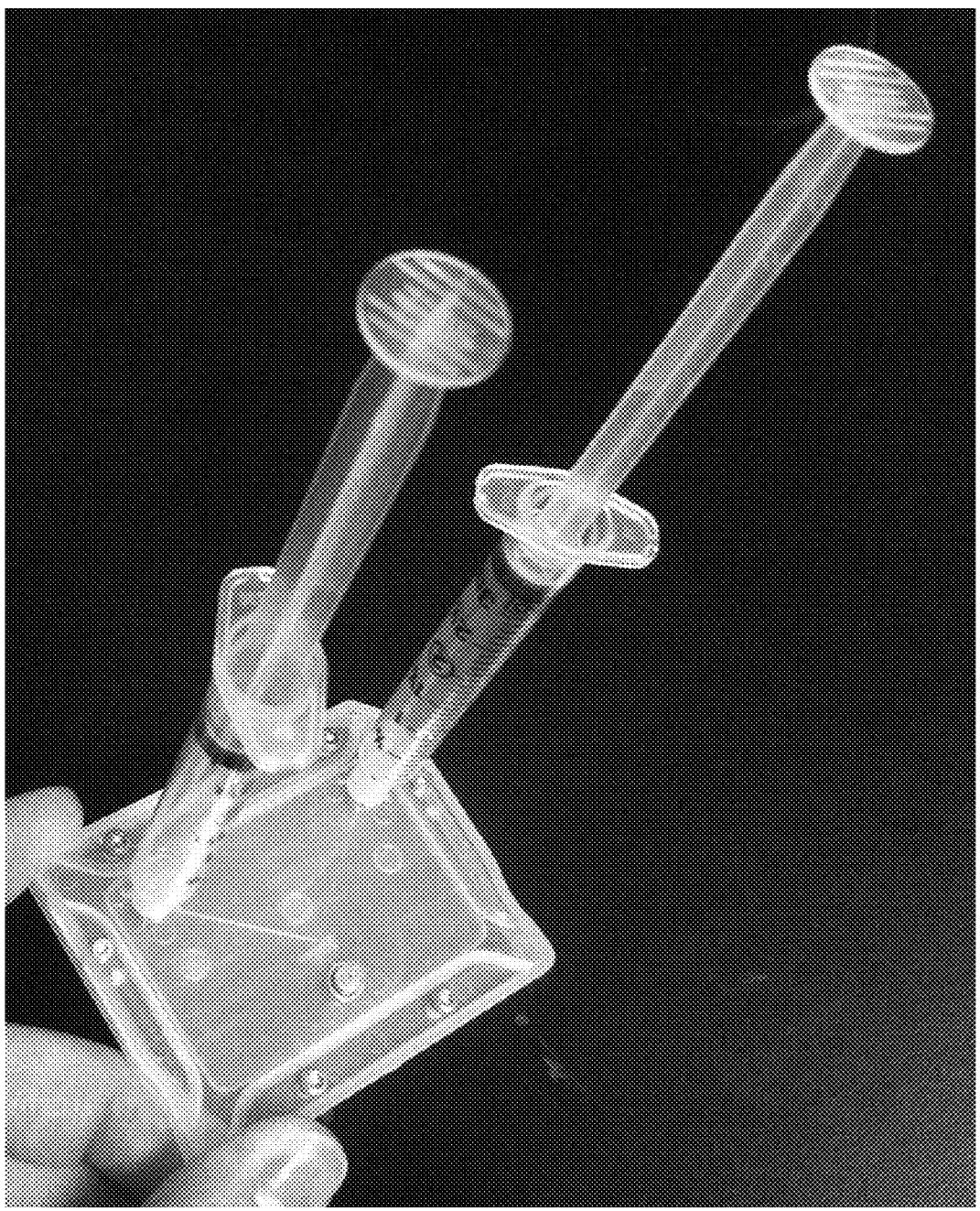
Figure 5F:
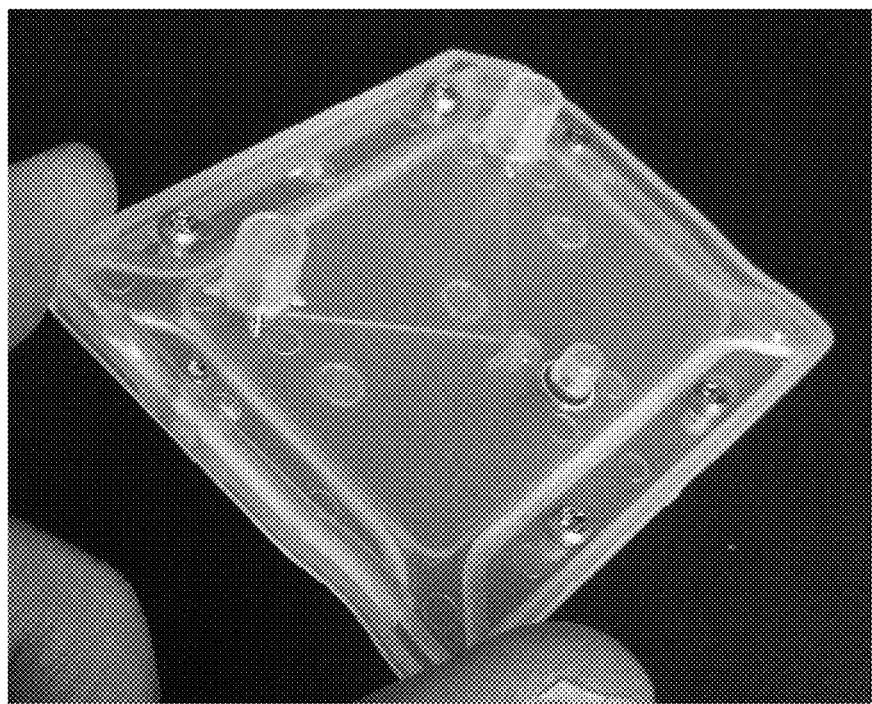
Figure 5G:
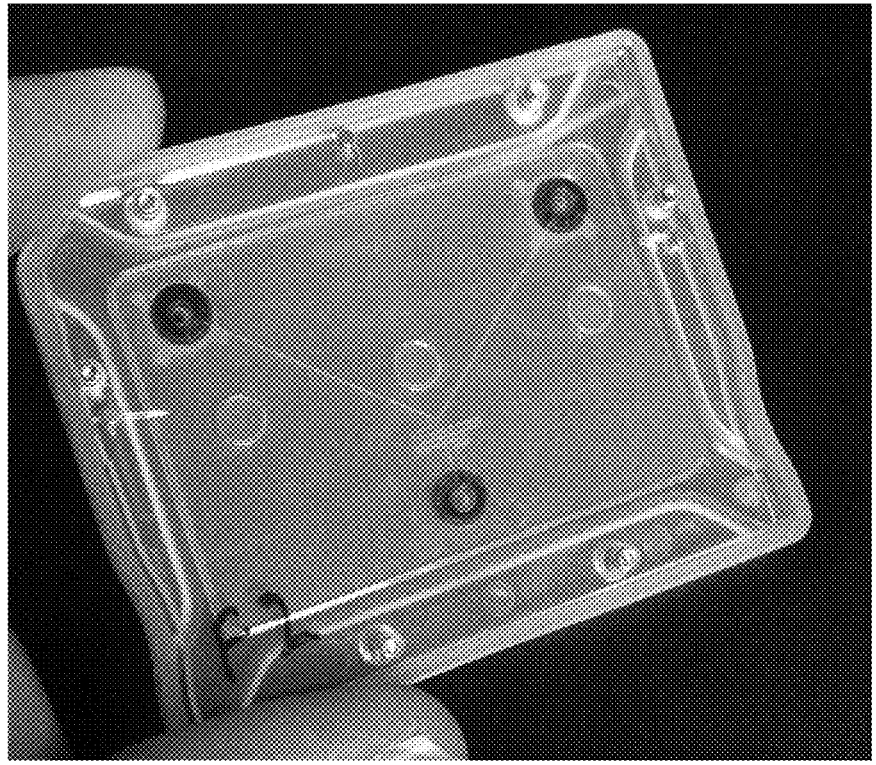
Figure 5H:
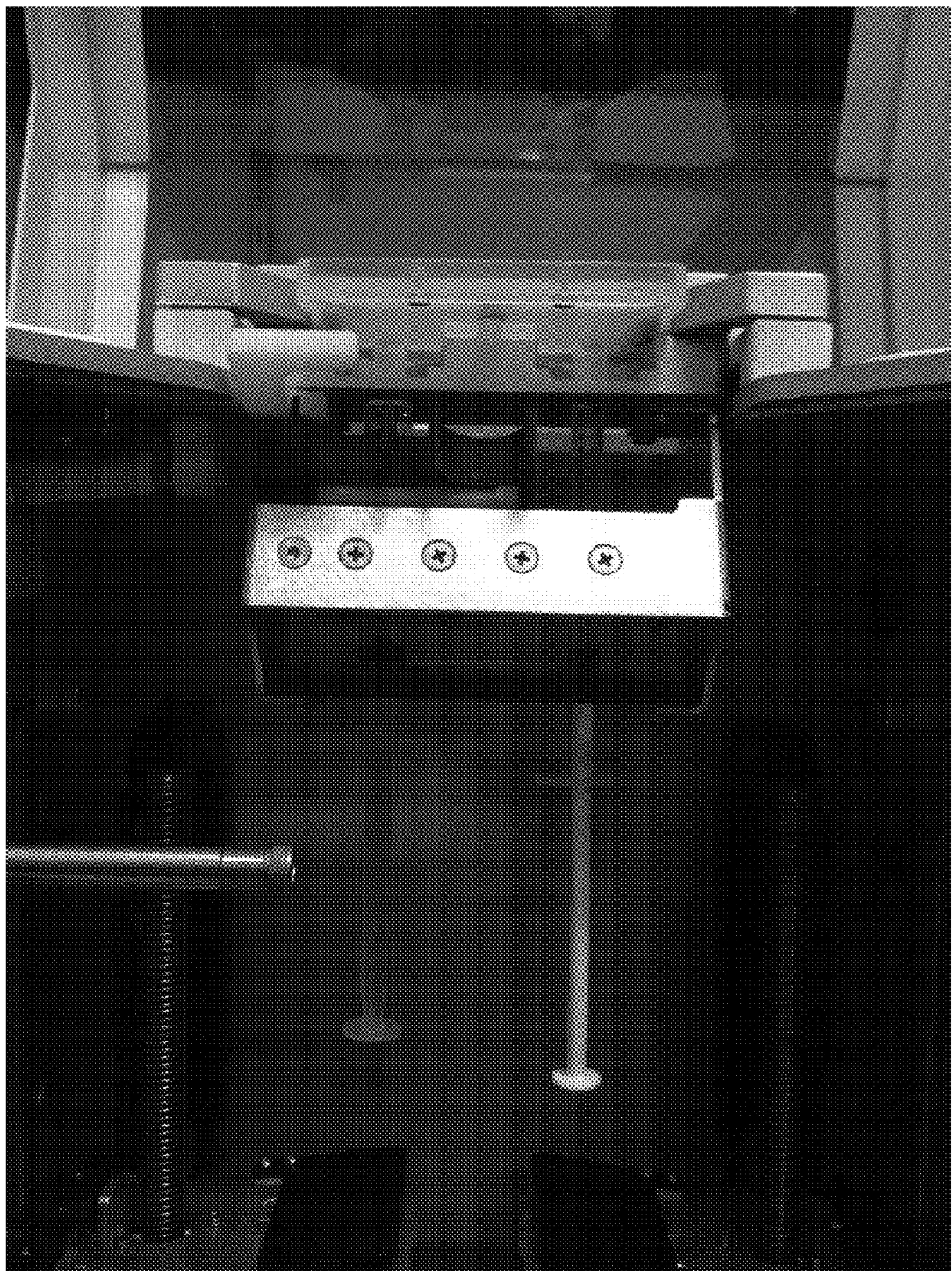

FIGS. 5C and 5H are pictures depicting a microfluidic system including a holder facilitating a connection between a microfluidic cartridge and two syringes. The pictured holder also includes platforms configured to operate the syringes and facilitate mixing.

Methods of using the microfluidic cartridge also include methods performed in a sterile environment, as is desirable when forming certain nanoparticles (e.g., nano-medicines). Accordingly, in one embodiment, the microfluidic cartridge has a sterile fluid path. Such embodiments and advantages are described above with regard to the microfluidic cartridge.

In one embodiment, the method further includes a step of sterilizing the fluid path prior to the step of flowing the first solution and the second solution through the microfluidic cartridge.

In one embodiment, the step of sterilizing the fluid path comprises sterilizing the microfluidic cartridge with radiation.

In one embodiment, the step of sterilizing the fluid path comprises sterilizing portions of the microfluidic cartridge prior to assembling the microfluidic cartridge.

In one embodiment, the sterile fluid path comprises a fluidic path from the first inlet connector and the second inlet connector, through the microfluidic structure, and to the outlet opening.

In one embodiment, the sterile fluid path further comprises a first syringe, containing the first solution, coupled to the first inlet.

In one embodiment, the sterile fluid path further comprises a second syringe, containing the second solution, coupled to the second inlet.

In one embodiment, the sterile fluid path further comprises a sterile receptacle coupled with the outlet opening of the microfluidic cartridge via an outlet opening connector, and wherein the method further comprises a step of delivering the nanoparticle solution from the mixer to the sterile receptacle via the outlet microchannel and outlet opening.

In one embodiment, the method does not include a step of integrally incorporating the microfluidic structure into the carrier. One of the advantages of the microfluidic cartridge is the lack of need to assemble a microfluidic chip into a carrier. Therefore, when performing the method according to this embodiment, no assembly of the microfluidic cartridge is performed.

In one embodiment, the method further includes a step of removing the microfluidic cartridge from a sterile package prior to the step of flowing the first solution and the second solution through the microfluidic cartridge. With regard to sterile methods of using the microfluidic cartridges, and when the microfluidic cartridge is provided in a sterile package, the method includes a step of removing the microfluidic cartridge from the sterile package prior to its use to mix a solution.

Definitions

Microfluidic

As used herein, the term "microfluidic" refers to a system or device for manipulating (e.g., flowing, mixing, etc.) a fluid sample including at least one channel having micron-scale dimensions (i.e., a dimension less than 1 mm).

Therapeutic Material

As used herein, the term "therapeutic material" is defined as a substance intended to furnish pharmacological activity or to otherwise have direct effect in the diagnosis, cure, mitigation, understanding, treatment or prevention of disease, or to have direct effect in restoring, correcting or modifying physiological functions. Therapeutic material includes but is not limited to small molecule drugs, nucleic acids, proteins, peptides, polysaccharides, inorganic ions and radionuclides.

Nanoparticles

As used herein, the term "nanoparticles" is defined as a homogeneous particle comprising more than one component material (for instance lipid, polymer etc.) that is used to encapsulate a therapeutic material and possesses a smallest dimension that is less than 250 nanometers. Nanoparticles include, but are not limited to, lipid nanoparticles and polymer nanoparticles.

Lipid Nanoparticles

In one embodiment, lipid nanoparticles, comprise:
(a) a core; and
(b) a shell surrounding the core, wherein the shell comprises a phospholipid.

In one embodiment, the core comprises a lipid (e.g., a fatty acid triglyceride) and is solid. In another embodiment, the core is liquid (e.g., aqueous) and the particle is a vesicle, such as a liposomes. In one embodiment, the shell surrounding the core is a monolayer.

As noted above, in one embodiment, the lipid core comprises a fatty acid triglyceride. Suitable fatty acid triglycerides include C8-C20 fatty acid triglycerides. In one embodiment, the fatty acid triglyceride is an oleic acid triglyceride.

The lipid nanoparticle includes a shell comprising a phospholipid that surrounds the core. Suitable phospholipids include diacylphosphatidylcholines, diacylphosphatidylethanolamines, ceramides, sphingomyelins, dihydrosphingomyelins, cephalins, and cerebrosides. In one embodiment, the phospholipid is a C8-C20 fatty acid diacylphosphatidylcholine. A representative phospholipid is 1-palmitoyl-2-oleoyl phosphatidylcholine (POPC).

In certain embodiments, the ratio of phospholipid to fatty acid triglyceride is from 20:80 (mol:mol) to 60:40 (mol:mol). Preferably, the triglyceride is present in a ratio greater than 40% and less than 80%.

In certain embodiments, the nanoparticle further comprises a sterol. Representative sterols include cholesterol. In one embodiment, the ratio of phospholipid to cholesterol is 55:45 (mol:mol). In representative embodiments, the nanoparticle includes from 55-100% POPC and up to 10 mol % PEG-lipid.

In other embodiments, the lipid nanoparticles of the disclosure may include one or more other lipids including phosphoglycerides, representative examples of which include phosphatidylcholine, phosphatidylethanolamine, phosphatidylserine, phosphatidylinositol, phosphatidic acid, palmitoyloleoylphosphatidylcholine, lyosphosphatidylcholine, lysophosphatidylethanolamine, dipalmitoylphosphatidylcholine, dioleoylphosphatidylcholine, di stearoylphosphatidylcholine, and dilinoleoylphosphatidylcholine. Other compounds lacking in phosphorus, such as sphingolipid and glycosphingolipid families are useful. Triacylglycerols are also useful.

Representative nanoparticles of the disclosure have a diameter from about 10 to about 100 nm. The lower diameter limit is from about 10 to about 15 nm.

The limit size lipid nanoparticles of the disclosure can include one or more therapeutic and/or diagnostic agents. These agents are typically contained within the particle core. The nanoparticles of the disclosure can include a wide variety of therapeutic and/or diagnostic agents.

Suitable therapeutic agents include chemotherapeutic agents (i.e., anti-neoplastic agents), anesthetic agents, beta-adrenaergic blockers, anti-hypertensive agents, anti-depressant agents, anti-convulsant agents, anti-emetic agents, anti-histamine agents, anti-arrhytmic agents, and anti-malarial agents.

Representative antineoplastic agents include doxorubicin, daunorubicin, mitomycin, bleomycin, streptozocin, vinblastine, vincristine, mechlorethamine, hydrochloride, melphalan, cyclophosphamide, triethylenethiophosphoramide, carmaustine, lomustine, semustine, fluorouracil, hydroxyurea, thioguanine, cytarabine, floxuridine, decarbazine, cisplatin, procarbazine, vinorelbine, ciprofloxacion, norfloxacin, paclitaxel, docetaxel, etoposide, bexarotene, teniposide, tretinoin, isotretinoin, sirolimus, fulvestrant, valrubicin, vindesine, leucovorin, irinotecan, capecitabine, gemcitabine, mitoxantrone hydrochloride, oxaliplatin, adriamycin, methotrexate, carboplatin, estramustine, and pharmaceutically acceptable salts and thereof.

In another embodiment, lipid nanoparticles, are nucleic-acid lipid nanoparticles.

The term "nucleic acid-lipid nanoparticles" refers to lipid nanoparticles containing a nucleic acid. The lipid nanoparticles include one or more cationic lipids, one or more second lipids, and one or more nucleic acids.

Cationic lipid. The lipid nanoparticles include a cationic lipid. As used herein, the term "cationic lipid" refers to a lipid that is cationic or becomes cationic (protonated) as the pH is lowered below the pK of the ionizable group of the lipid, but is progressively more neutral at higher pH values. At pH values below the pK, the lipid is then able to associate with negatively charged nucleic acids (e.g., oligonucleotides). As used herein, the term "cationic lipid" includes zwitterionic lipids that assume a positive charge on pH decrease.

The term "cationic lipid" refers to any of a number of lipid species which carry a net positive charge at a selective pH, such as physiological pH. Such lipids include, but are not limited to, N,N-dioleyl-N,N-dimethylammonium chloride (DODAC); N-(2,3-dioleyloxy)propyl)-N,N,N-trimethylammonium chloride (DOTMA); N,N-distearyl-N,N-dimethylammonium bromide (DDAB); N-(2,3-dioleoyloxy)propyl)-N,N,N-trimethylammonium chloride (DOTAP); 3-(N—(N', N'-dimethylaminoethane)-carbamoyl)cholesterol (DC-Chol) and N-(1,2-dimyristyloxyprop-3-yl)-N,N-dimethyl-N-hydroxyethyl ammonium bromide (DMRIE). Additionally, a number of commercial preparations of cationic lipids are available which can be used in the present disclosure. These include, for example, LIPOFECTIN® (commercially available cationic liposomes comprising DOTMA and 1,2-dioleoyl-sn-3-phosphoethanolamine (DOPE), from GIBCO/BRL, Grand Island, N.Y.); LIPOFECTAMINE® (commercially available cationic liposomes comprising N-(1-(2,3-dioleyloxy)propyl)-N-(2-(sperminecarboxamido)ethyl)-N,N-dimethylammonium trifluoroacetate (DOSPA) and (DOPE), from GIBCO/BRL); and TRANSFECTAM® (commercially available cationic lipids comprising dioctadecylamidoglycyl carboxyspermine (DOGS) in ethanol from Promega Corp., Madison, Wis.). The following lipids are cationic and have a positive charge at below physiological pH: DODAP, DODMA, DMDMA, 1,2-dilinoleyloxy-N,N-dimethylaminopropane (DLinDMA), 1,2-dilinolenyloxy-N,N-dimethylaminopropane (DLenDMA).

In one embodiment, the cationic lipid is an amino lipid. Suitable amino lipids useful in the disclosure include those described in WO 2009/096558, incorporated herein by reference in its entirety. Representative amino lipids include 1,2-dilinoleyoxy-3-(dimethylamino)acetoxypropane (DLin-DAC), 1,2-dilinoleyoxy-3-morpholinopropane (DLin-MA), 1,2-dilinoleoyl-3-dimethylaminopropane (DLinDAP), 1,2-dilinoleylthio-3-dimethylaminopropane (DLin-S-DMA), 1-linoleoyl-2-linoleyloxy-3-dimethylaminopropane (DLin-2-DMAP), 1,2-dilinoleyloxy-3-trimethylaminopropane chloride salt (DLin-TMA.Cl), 1,2-dilinoleoyl-3-trimethylaminopropane chloride salt (DLin-TAP.Cl), 1,2-dilinoleyloxy-3-(N-methylpiperazino)propane (DLin-MPZ), 3-(N,N-dilinoleylamino)-1,2-propanediol (DLinAP), 3-(N,N-dioleylamino)-1,2-propanedio (DOAP), 1,2-dilinoleyloxo-3-(2-N,N-dimethylamino)ethoxypropane (DLin-EG-DMA), and 2,2-dilinoleyl-4-dimethylaminomethyl-[1,3]-dioxolane (DLin-K-DMA).

Suitable amino lipids include those having the formula:

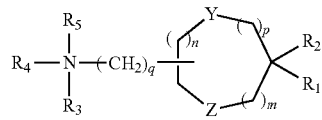

wherein $R_1$ and $R_2$ are either the same or different and independently optionally substituted $C_{10}$-$C_{24}$ alkyl, optionally substituted $C_{10}$-$C_{24}$ alkenyl, optionally substituted $C_{10}$-$C_{24}$ alkynyl, or optionally substituted $C_{10}$-$C_{24}$ acyl;

$R_3$ and $R_4$ are either the same or different and independently optionally substituted $C_1$-$C_6$ alkyl, optionally substituted $C_2$-$C_6$ alkenyl, or optionally substituted $C_2$-$C_6$ alkynyl or $R_3$ and $R_4$ may join to form an optionally substituted heterocyclic ring of 4 to 6 carbon atoms and 1 or 2 heteroatoms chosen from nitrogen and oxygen;

$R_5$ is either absent or present and when present is hydrogen or $C_1$-$C_6$ alkyl;

m, n, and p are either the same or different and independently either 0 or 1 with the proviso that m, n, and p are not simultaneously 0;

q is 0, 1, 2, 3, or 4; and

Y and Z are either the same or different and independently O, S, or NH.

In one embodiment, $R_1$ and $R_2$ are each linoleyl, and the amino lipid is a dilinoleyl amino lipid. In one embodiment, the amino lipid is a dilinoleyl amino lipid.

A representative useful dilinoleyl amino lipid has the formula:

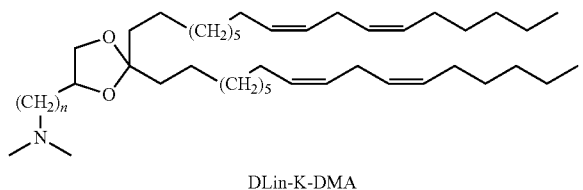

DLin-K-DMA wherein n is 0, 1, 2, 3, or 4.

In one embodiment, the cationic lipid is a DLin-K-DMA. In one embodiment, the cationic lipid is DLin-KC2-DMA (DLin-K-DMA above, wherein n is 2).

Other suitable cationic lipids include cationic lipids, which carry a net positive charge at about physiological pH, in addition to those specifically described above, N,N-dioleyl-N,N-dimethylammonium chloride (DODAC); N-(2, 3-dioleyloxy)propyl-N,N—N-triethylammonium chloride (DOTMA); N,N-distearyl-N,N-dimethylammonium bromide (DDAB); N-(2,3-dioleoyloxy)propyl)-N,N,N-trimethylammonium chloride (DOTAP); 1,2-dioleyloxy-3-trimethylaminopropane chloride salt (DOTAP.Cl); 3β-(N—(N',N'-dimethylaminoethane)carbamoyl)cholesterol (DC-Chol), N-(1-(2,3-dioleoyloxy)propyl)-N-2-(sperminecarboxamido)

ethyl)-N,N-dimethylammonium trifluoracetate (DOSPA), dioctadecylamidoglycyl carboxyspermine (DOGS), 1,2-dioleoyl-3-dimethylammonium propane (DODAP), N,N-dimethyl-2,3-dioleoyloxy)propylamine (DODMA), and N-(1,2-dimyristyloxyprop-3-yl)-N,N-dimethyl-N-hydroxyethyl ammonium bromide (DMRIE). Additionally, a number of commercial preparations of cationic lipids can be used, such as, e.g., LIPOFECTIN (including DOTMA and DOPE, available from GIBCO/BRL), and LIPOFECTAMINE (comprising DOSPA and DOPE, available from GIBCO/BRL).

The cationic lipid is present in the lipid particle in an amount from about 30 to about 95 mole percent. In one embodiment, the cationic lipid is present in the lipid particle in an amount from about 30 to about 70 mole percent. In one embodiment, the cationic lipid is present in the lipid particle in an amount from about 40 to about 60 mole percent.

In one embodiment, the lipid particle includes ("consists of") only of one or more cationic lipids and one or more nucleic acids.

Second lipids. In certain embodiments, the lipid nanoparticles include one or more second lipids. Suitable second lipids stabilize the formation of nanoparticles during their formation.

The term "lipid" refers to a group of organic compounds that are esters of fatty acids and are characterized by being insoluble in water but soluble in many organic solvents. Lipids are usually divided in at least three classes: (1) "simple lipids" which include fats and oils as well as waxes; (2) "compound lipids" which include phospholipids and glycolipids; and (3) "derived lipids" such as steroids.

Suitable stabilizing lipids include neutral lipids and anionic lipids.

Neutral Lipid. The term "neutral lipid" refers to any one of a number of lipid species that exist in either an uncharged or neutral zwitterionic form at physiological pH. Representative neutral lipids include diacylphosphatidylcholines, diacylphosphatidylethanolamines, ceramides, sphingomyelins, dihydrosphingomyelins, cephalins, and cerebrosides.

Exemplary lipids include, for example, distearoylphosphatidylcholine (DSPC), dioleoylphosphatidylcholine (DOPC), dipalmitoylphosphatidylcholine (DPPC), dioleoylphosphatidylglycerol (DOPG), dipalmitoylphosphatidylglycerol (DPPG), dioleoyl-phosphatidylethanolamine (DOPE), palmitoyloleoylphosphatidylcholine (POPC), palmitoyloleoyl-phosphatidylethanolamine (POPE) and dioleoyl-phosphatidylethanolamine 4-(N-maleimidomethyl)-cyclohexane-1-carboxylate (DOPE-mal), dipalmitoyl phosphatidyl ethanolamine (DPPE), dimyristoylphosphoethanolamine (DMPE), distearoyl-phosphatidylethanolamine (DSPE), 16-O-monomethyl PE, 16-O-dimethyl PE, 18-1-trans PE, 1-stearoyl-2-oleoyl-phosphatidyethanolamine (SOPE), and 1,2-dielaidoyl-sn-glycero-3-phophoethanolamine (transDOPE).

In one embodiment, the neutral lipid is 1,2-distearoyl-sn-glycero-3-phosphocholine (DSPC).

Anionic Lipid. The term "anionic lipid" refers to any lipid that is negatively charged at physiological pH. These lipids includephosphatidylglycerol, cardiolipin, diacylphosphatidylserine, diacylphosphatidic acid, N-dodecanoylphosphatidylethanol-amines, N-succinylphosphatidylethanolamines, N-glutarylphosphatidylethanolamines, lysylphosphatidylglycerols, palmitoyloleyolphosphatidylglycerol (POPG), and other anionic modifying groups joined to neutral lipids.

Other suitable lipids include glycolipids (e.g., monosialoganglioside $GM_1$). Other suitable second lipids include sterols, such as cholesterol.

Polyethylene glycol-lipids. In certain embodiments, the second lipid is a polyethylene glycol-lipid. Suitable polyethylene glycol-lipids include PEG-modified phosphatidylethanolamine, PEG-modified phosphatidic acid, PEG-modified ceramides (e.g., PEG-CerC14 or PEG-CerC20), PEG-modified dialkylamines, PEG-modified diacylglycerols, PEG-modified dialkylglycerols. Representative polyethylene glycol-lipids include PEG-c-DOMG, PEG-c-DMA, and PEG-s-DMG. In one embodiment, the polyethylene glycol-lipid is N-[(methoxy poly(ethylene glycol)$_{2000}$)carbamyl]-1,2-dimyristyloxlpropyl-3-amine (PEG-c-DMA). In one embodiment, the polyethylene glycol-lipid is PEG-c-DOMG).

In certain embodiments, the second lipid is present in the lipid particle in an amount from about 0.5 to about 10 mole percent. In one embodiment, the second lipid is present in the lipid particle in an amount from about 1 to about 5 mole percent. In one embodiment, the second lipid is present in the lipid particle in about 1 mole percent.

Nucleic Acids. The lipid nanoparticles of the present disclosure are useful for the systemic or local delivery of nucleic acids. As described herein, the nucleic acid is incorporated into the lipid particle during its formation.

As used herein, the term "nucleic acid" is meant to include any oligonucleotide or polynucleotide. Fragments containing up to 50 nucleotides are generally termed oligonucleotides, and longer fragments are called polynucleotides. In particular embodiments, oligonucleotides of the present disclosure are 20-50 nucleotides in length. In the context of this disclosure, the terms "polynucleotide" and "oligonucleotide" refer to a polymer or oligomer of nucleotide or nucleoside monomers consisting of naturally occurring bases, sugars and intersugar (backbone) linkages. The terms "polynucleotide" and "oligonucleotide" also includes polymers or oligomers comprising non-naturally occurring monomers, or portions thereof, which function similarly. Such modified or substituted oligonucleotides are often preferred over native forms because of properties such as, for example, enhanced cellular uptake and increased stability in the presence of nucleases. Oligonucleotides are classified as deoxyribooligonucleotides or ribooligonucleotides. A deoxyribooligonucleotide consists of a 5-carbon sugar called deoxyhbose joined covalently to phosphate at the 5' and 3' carbons of this sugar to form an alternating, unbranched polymer. A ribooligonucleotide consists of a similar repeating structure where the 5-carbon sugar is ribose. The nucleic acid that is present in a lipid particle according to this disclosure includes any form of nucleic acid that is known. The nucleic acids used herein can be single-stranded DNA or RNA, or double-stranded DNA or RNA, or DNA-RNA hybrids. Examples of double-stranded DNA include structural genes, genes including control and termination regions, and self-replicating systems such as viral or plasmid DNA. Examples of double-stranded RNA include siRNA and other RNA interference reagents. Single-stranded nucleic acids include antisense oligonucleotides, ribozymes, microRNA, mRNA, and triplex-forming oligonucleotides.

In one embodiment, the polynucleic acid is an antisense oligonucleotide. In certain embodiments, the nucleic acid is an antisense nucleic acid, a ribozyme, tRNA, snRNA, siRNA, shRNA, ncRNA, miRNA, mRNA, lncRNA, sgRNA, pre-condensed DNA, or an aptamer.

The term "nucleic acids" also refers to ribonucleotides, deoxynucleotides, modified ribonucleotides, modified deoxyribonucleotides, modified phosphate-sugar-backbone oligonucleotides, other nucleotides, nucleotide analogs, and combinations thereof, and can be single stranded, double stranded, or contain portions of both double stranded and single stranded sequence, as appropriate.

The term "nucleotide", as used herein, generically encompasses the following terms, which are defined below: nucleotide base, nucleoside, nucleotide analog, and universal nucleotide.

The term "nucleotide base", as used herein, refers to a substituted or unsubstituted parent aromatic ring or rings. In some embodiments, the aromatic ring or rings contain at least one nitrogen atom. In some embodiments, the nucleotide base is capable of forming Watson-Crick and/or Hoogsteen hydrogen bonds with an appropriately complementary nucleotide base. Exemplary nucleotide bases and analogs thereof include, but are not limited to, purines such as 2-aminopurine, 2,6-diaminopurine, adenine (A), ethenoadenine, N6-2-isopentenyladenine (6iA), N6-2-isopentenyl-2-methylthioadenine (2ms6iA), N6-methyladenine, guanine (G), isoguanine, N2-dimethylguanine (dmG), 7-methylguanine (7mG), 2-thiopyrimidine, 6-thioguanine (6sG) hypoxanthine and O6-methylguanine; 7-deaza-purines such as 7-deazaadenine (7-deaza-A) and 7-deazaguanine (7-deaza-G); pyrimidines such as cytosine (C), 5-propynylcytosine, isocytosine, thymine (T), 4-thiothymine (4sT), 5,6-dihydrothymine, O4-methylthymine, uracil (U), 4-thiouracil (4sU) and 5,6-dihydrouracil (dihydrouracil; D); indoles such as nitroindole and 4-methylindole; pyrroles such as nitropyrrole; nebularine; base (Y); In some embodiments, nucleotide bases are universal nucleotide bases. Additional exemplary nucleotide bases can be found in Fasman, 1989, Practical Handbook of Biochemistry and Molecular Biology, pp. 385-394, CRC Press, Boca Raton, Fla., and the references cited therein. Further examples of universal bases can be found for example in Loakes, N. A. R. 2001, vol 29:2437-2447 and Seela N. A. R. 2000, vol 28:3224-3232.

The term "nucleoside", as used herein, refers to a compound having a nucleotide base covalently linked to the C-1' carbon of a pentose sugar. In some embodiments, the linkage is via a heteroaromatic ring nitrogen. Typical pentose sugars include, but are not limited to, those pentoses in which one or more of the carbon atoms are each independently substituted with one or more of the same or different —R, —OR, —NRR or halogen groups, where each R is independently hydrogen, (C1-C6) alkyl or (C5-C14) aryl. The pentose sugar may be saturated or unsaturated. Exemplary pentose sugars and analogs thereof include, but are not limited to, ribose, 2'-deoxyribose, 2'-(C1-C6)alkoxyribose, 2'-(C5-C14)aryloxyribose, 2',3'-dideoxyribose, 2',3'-didehydroribose, 2'-deoxy-3'-haloribose, 2'-deoxy-3'-fluororibose, 2'-deoxy-3'-chlororibose, 2'-deoxy-3'-aminoribose, 2'-deoxy-3'-(C1-C6)alkylribose, 2'-deoxy-3'-(C1-C6)alkoxyribose and 2'-deoxy-3'-(C5-C14)aryloxyribose. Also see, e.g., 2'-O-methyl, 4'-.alpha.-anomeric nucleotides, 1'-.alpha.-anomeric nucleotides (Asseline (1991) Nucl. Acids Res. 19:4067-74), 2'-4'- and 3'-4'-linked and other "locked" or "LNA", bicyclic sugar modifications (WO 98/22489; WO 98/39352; WO 99/14226). "LNA" or "locked nucleic acid" is a DNA analogue that is conformationally locked such that the ribose ring is constrained by a methylene linkage between the 2'-oxygen and the 3'- or 4'-carbon. The conformation restriction imposed by the linkage often increases binding affinity for complementary sequences and increases the thermal stability of such duplexes.

Sugars include modifications at the 2'- or 3'-position such as methoxy, ethoxy, allyloxy, isopropoxy, butoxy, isobutoxy, methoxyethyl, alkoxy, phenoxy, azido, amino, alkylamino, fluoro, chloro and bromo. Nucleosides and nucleotides include the natural D configurational isomer (D-form), as well as the L configurational isomer (L-form) (Beigelman, U.S. Pat. No. 6,251,666; Chu, U.S. Pat. No. 5,753,789; Shudo, EP0540742; Garbesi (1993) Nucl. Acids Res. 21:4159-65; Fujimori (1990) J. Amer. Chem. Soc. 112:7435; Urata, (1993) Nucleic Acids Symposium Ser. No. 29:69-70). When the nucleobase is purine, e.g., A or G, the ribose sugar is attached to the N9-position of the nucleobase. When the nucleobase is pyrimidine, e.g., C, T or U, the pentose sugar is attached to the N1-position of the nucleobase (Kornberg and Baker, (1992) DNA Replication, $2^{nd}$ Ed., Freeman, San Francisco, Calif.).

One or more of the pentose carbons of a nucleoside may be substituted with a phosphate ester. In some embodiments, the phosphate ester is attached to the 3'- or 5'-carbon of the pentose. In some embodiments, the nucleosides are those in which the nucleotide base is a purine, a 7-deazapurine, a pyrimidine, a universal nucleotide base, a specific nucleotide base, or an analog thereof.

The term "nucleotide analog", as used herein, refers to embodiments in which the pentose sugar and/or the nucleotide base and/or one or more of the phosphate esters of a nucleoside may be replaced with its respective analog. In some embodiments, exemplary pentose sugar analogs are those described above. In some embodiments, the nucleotide analogs have a nucleotide base analog as described above. In some embodiments, exemplary phosphate ester analogs include, but are not limited to, alkylphosphonates, methylphosphonates, phosphoramidates, phosphotriesters, phosphorothioates, phosphorodithioates, phosphoroselenoates, phosphorodiselenoates, phosphoroanilothioates, phosphoroanilidates, phosphoroamidates, boronophosphates, and may include associated counterions. Other nucleic acid analogs and bases include for example intercalating nucleic acids (INAs, as described in Christensen and Pedersen, 2002), and AEGIS bases (Eragen, U.S. Pat. No. 5,432,272). Additional descriptions of various nucleic acid analogs can also be found for example in (Beaucage et al., Tetrahedron 49(10):1925 (1993) and references therein; Letsinger, J. Org. Chem. 35:3800 (1970); Sprinzl et al., Eur. J. Biochem. 81:579 (1977); Letsinger et al., Nucl. Acids Res. 14:3487 (1986); Sawai et al., Chem. Lett. 805 (1984), Letsinger et al., J. Am. Chem. Soc. 110:4470 (1988); and Pauwels et al., Chemica Scripta 26:141 91986)), phosphorothioate (Mag et al., Nucleic Acids Res. 19:1437 (1991); and U.S. Pat. No. 5,644,048. Other nucleic analogs comprise phosphorodithioates (Briu et al., J. Am. Chem. Soc. 111:2321 (1989), O-methylphophoroamidite linkages (see Eckstein, Oligonucleotides and Analogues: A Practical Approach, Oxford University Press), those with positive backbones (Denpcy et al., Proc. Natl. Acad. Sci. USA 92:6097 (1995); non-ionic backbones (U.S. Pat. Nos. 5,386,023, 5,386,023, 5,637,684, 5,602,240, 5,216,141, and 4,469,863. Kiedrowshi et al., Angew. Chem. Intl. Ed. English 30:423 (1991); Letsinger et al., J. Am. Chem. Soc. 110:4470 (1988); Letsinger et al., Nucleoside & Nucleotide 13:1597 (194): Chapters 2 and 3, ASC Symposium Series 580, "Carbohydrate Modifications in Antisense Research", Ed. Y. S. Sanghui and P. Dan Cook; Mesmaeker et al., Bioorganic & Medicinal Chem. Lett. 4:395 (1994); Jeffs et al., J. Biomolecular NMR 34:17 (1994); Tetrahedron Lett. 37:743 (1996)) and non-ribose backbones, including those described in U.S. Pat. Nos. 5,235,033 and 5,034,506, and Chapters 6 and 7, ASC Symposium Series 580, "Carbohydrate Modifications in Antisense Research", Ed. Y. S. Sanghui and P. Dan Cook. Nucleic acids containing one or more carbocyclic sugars are also included within the definition of nucleic acids (see Jenkins et al., Chem. Soc. Rev. (1995) pp 169-176). Several nucleic acid analogs are also described in Rawls, C & E News Jun. 2, 1997 page 35.

The term "universal nucleotide base" or "universal base", as used herein, refers to an aromatic ring moiety, which may or may not contain nitrogen atoms. In some embodiments, a universal base may be covalently attached to the C-1' carbon of a pentose sugar to make a universal nucleotide. In some embodiments, a universal nucleotide base does not hydrogen bond specifically with another nucleotide base. In some embodiments, a universal nucleotide base hydrogen bonds with nucleotide base, up to and including all nucleotide bases in a particular target polynucleotide. In some embodiments, a nucleotide base may interact with adjacent nucleotide bases on the same nucleic acid strand by hydrophobic stacking. Universal nucleotides include, but are not limited to, deoxy-7-azaindole triphosphate (d7AITP), deoxyisocarbostyril triphosphate (dICSTP), deoxypropynylisocarbostyril triphosphate (dPICSTP), deoxymethyl-7-azaindole triphosphate (dM7AITP), deoxyImPy triphosphate (dImPyTP), deoxyPP triphosphate (dPPTP), or deoxypropynyl-7-azaindole triphosphate (dP7AITP). Further examples of such universal bases can be found, inter alia, in Published U.S. application Ser. No. 10/290,672, and U.S. Pat. No. 6,433,134.

As used herein, the terms "polynucleotide" and "oligonucleotide" are used interchangeably and mean single-stranded and double-stranded polymers of nucleotide monomers, including 2'-deoxyribonucleotides (DNA) and ribonucleotides (RNA) linked by internucleotide phosphodiester bond linkages, e.g., 3'-5' and 2'-5', inverted linkages, e.g., 3'-3' and 5'-5', branched structures, or internucleotide analogs. Polynucleotides have associated counter ions, such as H+, NH4+, trialkylammonium, Mg2+, Na+, and the like. A polynucleotide may be composed entirely of deoxyribonucleotides, entirely of ribonucleotides, or chimeric mixtures thereof. Polynucleotides may be comprised of internucleotide, nucleobase and/or sugar analogs. Polynucleotides typically range in size from a few monomeric units, e.g., 3-40 when they are more commonly frequently referred to in the art as oligonucleotides, to several thousands of monomeric nucleotide units. Unless denoted otherwise, whenever a polynucleotide sequence is represented, it will be understood that the nucleotides are in 5' to 3' order from left to right and that "A" denotes deoxyadenosine, "C" denotes deoxycytosine, "G" denotes deoxyguanosine, and "T" denotes thymidine, unless otherwise noted.

As used herein, "nucleobase" means those naturally occurring and those non-naturally occurring heterocyclic moieties commonly known to those who utilize nucleic acid technology or utilize peptide nucleic acid technology to thereby generate polymers that can sequence specifically bind to nucleic acids. Non-limiting examples of suitable nucleobases include: adenine, cytosine, guanine, thymine, uracil, 5-propynyl-uracil, 2-thio-5-propynyl-uracil, 5-methylcytosine, pseudoisocytosine, 2-thiouracil and 2-thiothymine, 2-aminopurine, N9-(2-amino-6-chloropurine), N9-(2,6-diaminopurine), hypoxanthine, N9-(7-deaza-guanine), N9-(7-deaza-8-aza-guanine) and N8-(7-deaza-8-aza-adenine). Other non-limiting examples of suitable nucleobase include those nucleobases illustrated in FIGS. 2(A) and 2(B) of Buchardt et al. (WO92/20702 or WO92/20703).

As used herein, "nucleobase sequence" means any segment, or aggregate of two or more segments (e.g. the aggregate nucleobase sequence of two or more oligomer blocks), of a polymer that comprises nucleobase-containing subunits. Non-limiting examples of suitable polymers or polymers segments include oligodeoxynucleotides (e.g. DNA), oligoribonucleotides (e.g. RNA), peptide nucleic acids (PNA), PNA chimeras, PNA combination oligomers, nucleic acid analogs and/or nucleic acid mimics.

As used herein, "polynucleobase strand" means a complete single polymer strand comprising nucleobase subunits. For example, a single nucleic acid strand of a double stranded nucleic acid is a polynucleobase strand.

As used herein, "nucleic acid" is a nucleobase sequence-containing polymer, or polymer segment, having a backbone formed from nucleotides, or analogs thereof.

Preferred nucleic acids are DNA and RNA.

As used herein, nucleic acids may also refer to "peptide nucleic acid" or "PNA" means any oligomer or polymer segment (e.g. block oligomer) comprising two or more PNA subunits (residues), but not nucleic acid subunits (or analogs thereof), including, but not limited to, any of the oligomer or polymer segments referred to or claimed as peptide nucleic acids in U.S. Pat. Nos. 5,539,082, 5,527,675, 5,623,049, 5,714,331, 5,718,262, 5,736,336, 5,773,571, 5,766,855, 5,786,461, 5,837,459, 5,891,625, 5,972,610, 5,986,053 and 6,107,470; all of which are herein incorporated by reference. The term "peptide nucleic acid" or "PNA" shall also apply to any oligomer or polymer segment comprising two or more subunits of those nucleic acid mimics described in the following publications: Lagriffoul et al., Bioorganic & Medicinal Chemistry Letters, 4: 1081-1082 (1994); Petersen et al., Bioorganic & Medicinal Chemistry Letters, 6: 793-796 (1996); Diderichsen et al., Tett. Lett. 37: 475-478 (1996); Fujii et al., Bioorg. Med. Chem. Lett. 7: 637-627 (1997); Jordan et al., Bioorg. Med. Chem. Lett. 7: 687-690 (1997); Krotz et al., Tett. Lett. 36: 6941-6944 (1995); Lagriffoul et al., Bioorg. Med. Chem. Lett. 4: 1081-1082 (1994); Diderichsen, U., Bioorganic & Medicinal Chemistry Letters, 7: 1743-1746 (1997); Lowe et al., J. Chem. Soc. Perkin Trans. 1, (1997) 1: 539-546; Lowe et J. Chem. Soc. Perkin Trans. 11: 547-554 (1997); Lowe et al., J. Chem. Soc. Perkin Trans. 11:555-560 (1997); Howarth et al., J. Org. Chem. 62: 5441-5450 (1997); Altmann, K-H et al., Bioorganic & Medicinal Chemistry Letters, 7: 1119-1122 (1997); Diderichsen, U., Bioorganic & Med. Chem. Lett., 8: 165-168 (1998); Diederichsen et al., Angew. Chem. Int. Ed., 37: 302-305 (1998); Cantin et al., Tett. Lett., 38: 4211-4214 (1997); Ciapetti et al., Tetrahedron, 53: 1167-1176 (1997); Lagriffoule et al., Chem. Eur. J., 3: 912-919 (1997); Kumar et al., Organic Letters 3(9): 1269-1272 (2001); and the Peptide-Based Nucleic Acid Mimics (PENAMS) of Shah et al. as disclosed in WO96/04000.

Polymer Nanoparticles

The term "polymer nanoparticles" refers to polymer nanoparticles containing a therapeutic material. Polymer nanoparticles have been developed using, a wide range of materials including, but not limited to: synthetic homopolymers such as polyethylene glycol, polylactide, polyglycolide, poly(lactide-coglycolide), polyacrylates, polymethacrylates, polycaprolactone, polyorthoesters, polyanhydrides, polylysine, polyethyleneimine; synthetic copolymers such as poly (lactide-coglycolide), poly(lactide)-poly(ethylene glycol), poly(lactide-co-glycolide)-poly(ethylene glycol), poly (caprolactone)-poly(ethylene glycol); natural polymers such as cellulose, chitin, and alginate, as well as polymer-therapeutic material conjugates.

As used herein, the term "polymer" refers to compounds of usually high molecular weight built up chiefly or completely from a large number of similar units bonded together. Such polymers include any of numerous natural, synthetic and semi-synthetic polymers.

The term "natural polymer" refers to any number of polymer species derived from nature. Such polymers include, but are not limited to the polysaccharides, cellulose, chitin, and alginate.

The term "synthetic polymer" refers to any number of synthetic polymer species not found in Nature. Such synthetic polymers include, but are not limited to, synthetic homopolymers and synthetic copolymers.

Synthetic homopolymers include, but are not limited to, polyethylene glycol, polylactide, polyglycolide, polyacrylates, polymethacrylates, poly _-caprolactone, polyorthoesters, polyanhydrides, polylysine, and polyethyleneimine.

"Synthetic copolymer" refers to any number of synthetic polymer species made up of two or more synthetic homopolymer subunits. Such synthetic copolymers include, but are not limited to, poly(lactide-co-glycolide), poly(lactide)-poly(ethylene glycol), poly(lactide-co-glycolide)-poly(ethylene glycol), and poly(_-caprolactone)-poly(ethylene glycol).

The term "semi-synthetic polymer" refers to any number of polymers derived by the chemical or enzymatic treatment of natural polymers. Such polymers include, but are not limited to, carboxymethyl cellulose, acetylated carboxymethylcellulose, cyclodextrin, chitosan and gelatin.

As used herein, the term "polymer conjugate" refers to a compound prepared by covalently, or non-covalently conjugating one or more molecular species to a polymer. Such polymer conjugates include, but are not limited to, polymer-therapeutic material conjugates.

Polymer-therapeutic material conjugate refers to a polymer conjugate where one or more of the conjugated molecular species is a therapeutic material. Such polymer-therapeutic material conjugates include, but are not limited to, polymer-drug conjugates.

"Polymer-drug conjugate" refers to any number of polymer species conjugated to any number of drug species. Such polymer drug conjugates include, but are not limited to, acetyl methylcellulose-polyethylene glycol-docetaxol.

As used herein, the term "about" indicates that the associated value can be modified, unless otherwise indicated, by plus or minus five percent (+/−5%) and remain within the scope of the embodiments disclosed.

The following example is included for the purpose of illustrating, not limiting, the described embodiments.

EXAMPLE

Example 1: Disposable Microfluidic Cartridge for Nanoparticle Manufacture

In one aspect, the fully integrated disposable microfluidic cartridge consists of an injection molded carrier; the COC microfluidic mixer structure; a laser cut clamp piece; three O-rings; three neodymium magnets and is held together using self-tapping plastic screws. Such a cartridge is illustrated in FIGS. 1A-3 and 5A-5H.

The carrier (16 mm×67 mm×55 mm) is injection molded from polypropylene. It consists of two female luer slip connectors (IS0594 compliant); an outlet nozzle (4 mm OD, 2 mm ID×4 mm); 3 O-ring grooves above the luer connectors and outlet nozzle (5.3 mm OD×0.9 mm); a receptacle for the microfluidic device (52 mm×36 mm×1.6 mm) and outer wall with a thickness of 1.8 mm and a height of 7 mm.

The clamp (63 mm×51 mm×⅛ in) is laser cut from acrylic. There are three holes in the clamp into which neodymium magnets are press fit and six pilot holes for self-taping screws.

The cartridge is assembled by placing an O-ring into each of the three grooves and laying a microfluidic mixer structure on top. Raised guides along the edge of the inside of the cartridge ensure that the cartridge falls into place with the ports aligned over the two inlets and the outlet without separate alignment. The acrylic clamp with neodymium magnets is then laid on top and held in place using a series of clips. The assembly is then inverted and secured together using six self-tapping screws.

The bulk of the microfluidic structure is made by injection molding COC.

The design of the microfluidic structure is similar to those pictured in the FIGURES The two microfluidic inlet ports are connected to channels with a square cross-section and travel to meet at an angle to form a single channel that enters a serpentine mixing region including a plurality of turns. The single channel leaves the mixing chamber and exits the device at an outlet port.

The flow rate through the Microfluidic Cartridge is 1-40 mL/min, and the time from the fluids meeting to complete mixing (mixing speed) is 1-3 ms. The pressure is estimated at 100 psi.

The disposable microfluidic cartridge has been demonstrated to be essentially as efficient as the existing chip/metal holder. Table 1 below presents data related to forming siRNA-lipid nanoparticles on an existing metal chip holder and chip configuration ("Chip Holder+Chip") comparted to a disposable microfluidic (MF) cartridge in accordance with disclosed embodiments. Comparisons are provided for nanoparticle size (nm); polydispersity index (PDI); and encapsulation efficiency for siRNA-Lipid Nanoparticles (siRNA-LNP). The flow rate for all data is 12 mL/min.

TABLE 1

Comparison of Microfluidic Formation of siRNA-Lipid Nanoparticles.

| | Size (nm) | PDI | Encap. Eff. (%) |
|---|---|---|---|
| Chip Holder + Chip | 70.9 | 0.146 | 98.1 |
| MF Cartridge | 65.3 | 0.122 | 97.6 |

In view of the results presented in Table 1, the disposable MF cartridge has substantially similar performance to the present state-of-the art non-disposable metal chip holder and chip. While the performance between the two microfluidic devices is similar, the disposable MF cartridge provides the added benefit of being disposable, conveniently sterilisable, and dramatically reducing set-up complexity and time.

While illustrative embodiments have been illustrated and described, it will be appreciated that various changes can be made therein without departing from the spirit and scope of the invention.

The embodiments of the invention in which an exclusive property or privilege is claimed are defined as follows:

1. A microfluidic cartridge that is disposable and is configured to mix a first solution with a second solution to produce a mixed solution, the microfluidic cartridge comprising:
   (A) a carrier, comprising a first inlet connector, a second inlet connector, and an outlet opening;
   (B) a microfluidic structure integrally incorporated into the carrier, the microfluidic structure comprising:

(I) a first inlet microchannel configured to receive fluid from first inlet connector;
(II) a second inlet microchannel configured to receive fluid from the second inlet connector;
(III) a mixer configured to:
  receive a first solution from the first inlet microchannel and a second solution from the second inlet microchannel;
  mix the first solution and the second solution to provide a mixed solution, and
  direct the mixed solution into an outlet microchannel; and
(IV) the outlet microchannel, which is in fluid communication with the outlet opening,
  wherein the mixer is a Dean Vortex Bifurcating Mixer (DVBM) comprising an inlet leading to a first leg channel and a second leg channel that define a circumference of a first toroidal mixing element.

2. The microfluidic cartridge of claim 1, wherein the microfluidic cartridge is configured for a single use.

3. The microfluidic cartridge of claim 1, further comprising a securing mechanism configured to secure the microfluidic cartridge to a holder.

4. The microfluidic cartridge of claim 3, wherein the securing mechanism comprises one or more magnets.

5. The microfluidic cartridge of claim 3, wherein the securing mechanism comprises a carrier locking feature on the carrier that is configured to lock with a holder locking feature on a compatible holder for the microfluidic cartridge.

6. The microfluidic cartridge of claim 1, wherein the carrier is at least 90%, by weight, polymer.

7. The microfluidic cartridge of claim 1, wherein the carrier does not include metal on an exterior surface.

8. The microfluidic cartridge of claim 1, wherein the microfluidic structure is not separable from the carrier.

9. The microfluidic cartridge of claim 1, wherein the carrier encloses the microfluidic structure.

10. The microfluidic cartridge of claim 1, wherein the carrier comprises a first portion, comprising the first inlet connector, the second inlet connector, and the outlet opening and a second portion, wherein the first portion and the second portion join to seal the microfluidic structure between the first portion and the second portion.

11. The microfluidic cartridge of claim 10, wherein the first portion and the second portion join to enclose the microfluidic structure.

12. The microfluidic cartridge of claim 10, wherein the first portion is at least 90%, by weight, polymer.

13. The microfluidic cartridge of claim 10, wherein the first portion or the second portion comprises the microfluidic structure.

14. The microfluidic cartridge of claim 1, wherein the first leg channel of the DVBM has a first impedance and the second leg channel of the DVBM has a second impedance, the first impedance being greater than the second impedance.

15. The microfluidic cartridge of claim 14, wherein the DVBM comprises a third leg channel and a fourth leg channel that define a circumference of a second toroidal mixing element that is in fluid communication with the first toroidal mixing element via a neck region, the third leg channel having a third impedance and the fourth leg channel having a fourth impedance, the third impedance being greater than the fourth impedance.

16. The microfluidic cartridge of claim 15, wherein a ratio of the first impedance to the second impedance is about equal to a ratio of the third impedance to the fourth impedance.

17. The microfluidic cartridge of claim 1, wherein the DVBM comprises a third leg channel and a fourth leg channel that define a circumference of a second toroidal mixing element that is in fluid communication with the first toroidal mixing element via a neck region, the first leg channel having a first length, the second leg channel having a second length, the third leg channel having a third length, the fourth leg channel having a fourth length, the first length being greater than the second length and the third length being greater than the fourth length.

18. The microfluidic cartridge of claim 1, wherein the first leg channel and the second leg channel each have a hydrodynamic diameter of about 20 microns to about 2 mm.

19. The microfluidic cartridge of claim 1, wherein the mixer is sized and configured to mix the first solution and the second solution at a Reynolds number of less than 1000.

20. The microfluidic cartridge of claim 1, wherein the mixer comprises between two and twenty toroidal mixing elements arranged in series.

21. The microfluidic cartridge of claim 1, wherein the microfluidic cartridge is sterile.

22. The microfluidic cartridge of claim 1, wherein the microfluidic cartridge includes a sterile fluid path, from the first inlet connector and the second inlet connector, through the microfluidic structure, and to the outlet opening.

23. A sterile package filled with sterile contents, comprising a microfluidic cartridge of claim 1 in a sterile state and sealed within the sterile package.

24. A method of forming nanoparticles, comprising flowing a first solution and a second solution through a microfluidic cartridge according to claim 1 and forming a nanoparticle solution in the mixer.

* * * * *